US010785901B2

(12) United States Patent
Gao et al.

(10) Patent No.: US 10,785,901 B2
(45) Date of Patent: Sep. 22, 2020

(54) OPTIMIZATION APPROACH FOR PLACEMENT HEADS TASKS ASSIGNMENT OF BEAM-TYPE SINGLE-GANTRY SURFACE MOUNTERS

(71) Applicant: Harbin Institute of Technology, Harbin, Heilongjiang Province (CN)

(72) Inventors: Huijun Gao, Harbin (CN); Zhengkai Li, Harbin (CN); Xinpeng Liu, Harbin (CN)

(*) Notice: Subject to any disclaimer, the term of this patent is extended or adjusted under 35 U.S.C. 154(b) by 0 days.

(21) Appl. No.: 16/512,089

(22) Filed: Jul. 15, 2019

(65) Prior Publication Data

US 2020/0030834 A1     Jan. 30, 2020

(30) Foreign Application Priority Data

Jul. 25, 2018    (CN) .......................... 2018 1 0829630

(51) Int. Cl.
*G06F 30/392*      (2020.01)
*H05K 13/04*       (2006.01)

(52) U.S. Cl.
CPC ....... *H05K 13/0404* (2013.01); *H05K 13/046* (2013.01); *G06F 30/392* (2020.01)

(58) Field of Classification Search
CPC .. H05K 13/0404; H05K 13/046; H05K 3/341; H05K 13/0465; G06F 30/392
See application file for complete search history.

(56) References Cited

U.S. PATENT DOCUMENTS

| | | | |
|---|---|---|---|
| 5,864,833 A * | 1/1999 | Schaffer ................. | H05K 13/04 706/13 |
| 5,909,674 A * | 6/1999 | Schaffer ............... | H05K 13/085 706/13 |
| 9,955,617 B2 * | 4/2018 | Nozawa ............ | H05K 13/0417 |
| 10,466,683 B2 * | 11/2019 | Ishimoto ............ | H05K 13/0882 |
| 10,537,051 B2 * | 1/2020 | Oyama ................. | H05K 13/08 |

(Continued)

OTHER PUBLICATIONS

Ayob, Masri, and Graham Kendall. "A survey of surface mount device placement machine optimisation: Machine classification." European Journal of Operational Research 186.3 (2008): 893-914. (Year: 2008).*

(Continued)

*Primary Examiner* — Michael D Masinick
(74) *Attorney, Agent, or Firm* — Novoclaims Patent Services LLC; Mei Lin Wong

(57) ABSTRACT

An optimization approach for placement heads tasks assignment of beam-type single-gantry surface mounter is disclosed, building a comprehensive framework that simultaneously achieves all optimization objectives in reasonably short time. Specific steps are as follows: (a) importing user-defined production parameters and forming raw production data, (b) pre-processing the raw production data and obtaining the intermediate production data that facilitates the subsequent processing, (c) verifying the loop condition of the "placement heads tasks assignment", (d) performing nozzle assignment, (e) confirming all the nozzle assignment exchange possibilities, (f) verifying whether the loop condition of "component allocation" are fulfilled, (g) performing component allocation, and (h) outputting the optimal placement heads tasks assignment results.

9 Claims, 11 Drawing Sheets

(56) References Cited

U.S. PATENT DOCUMENTS

| | | | |
|---|---|---|---|
| 2004/0073322 A1* | 4/2004 | Maenishi | H05K 13/0452 700/28 |
| 2006/0052893 A1* | 3/2006 | Yamazaki | H05K 13/085 700/100 |
| 2006/0229758 A1* | 10/2006 | Maenishi | H05K 13/085 700/121 |
| 2008/0154392 A1* | 6/2008 | Maenishi | H05K 13/0853 700/32 |
| 2009/0044401 A1* | 2/2009 | Maenishi | H05K 13/0413 29/740 |

OTHER PUBLICATIONS

Knuutila, Timo, et al. "Organizing the nozzle magazine of a gantry-type PCB assembly machine." The International Journal of Advanced Manufacturing Technology 68.5-8 (2013): 1189-1202 (Year: 2013).*

Torabi, S. A., M. Hamedi, and J. Ashayeri. "A new optimization approach for nozzle selection and component allocation in multi-head beam-type SMD placement machines." Journal of Manufacturing Systems 32.4 (2013): 700-714 (Year: 2013).*

\* cited by examiner

OPTIMIZATION APPROACH FOR PLACEMENT HEADS TASKS ASSIGNMENT OF BEAM-TYPE SINGLE-GANTRY SURFACE MOUNTERS

CROSS REFERENCE OF RELATED APPLICATION

This non-provisional patent application claims priority of Chinese application number 201810829630.8, filing date Jul. 25, 2018. The content of this specification is incorporated herein by reference.

BACKGROUND OF THE PRESENT INVENTION

Field of Invention

The present invention relates to an improved optimization approach for surface mount technology of surface mounters, and more particularly to an optimization approach for placement heads tasks assignment of beam-type single-gantry surface mounters, involving electrical technology and electrical engineering.

Description of Related Arts

Various electronic devices are playing an increasingly important role in different aspects of modern life and production activities. This in turn requires the production of Printed Circuit Boards (PCB) to meet high-density, high-complexity, large-scale and flexible production needs. As a dominant assembly technology of PCBs, Surface Mount Technology (SMT) has grown very rapidly. The most critical and complex equipment on a typical SMT production line is the surface mounter, which is arranged to place electronic components on corresponding soldering spots on the surface of PCB at a high speed, high precision, fully automatic manner. Generally speaking, pick-and-place (PAP) processes of the surface mounter consumes the greatest amount of time in the SMT production line, and they have become the major bottleneck for the improvement of SMT production efficiency. As a result, optimization of the pick-and-place process of the surface mounter may be designed to maximize the overall productivity of the surface mounter by reasonably planning and controlling the pick-and-place processes. The optimization of the pick-and-place process can be divided into two steps, that is placement heads tasks assignment and pick-and-place sequence scheduling. The present invention involves placement heads tasks assignment, which specifically refers to an optimization approach for placement heads tasks assignment of beam-type single-gantry surface mounters.

The term "PCB" is an abbreviation of "Printed Circuit Board". Printed circuit board is a carrier for electrical connection of various electronic components. Usually, a number of bonding pads on a PCB surface are designated for placement of electronic components. After placement, the components leads are soldered to the corresponding bonding pads with solder paste on the PCB. Bonding pads and soldered electronic components on the PCBs are then electrically connected through the conducting paths within the PCB.

"SMT component" refers to an electronic component that is connected to the bonding pads of PCB through surface mount technology. The term is distinguishable from through-hole technology in which electronic components are connected to the pads of PCB via through holes. The present invention only refers to "SMT components", which will also be referred to as "components" or "electronic components" hereinafter. The positions for placing the components on the surface of the PCB may be referred to as "placement points".

The "pick-and-place process" (PAP process, for short) refers to the process by which components are picked and placed on the placement points of one PCB.

Several related patents and patent applications are listed in Table 1 below:

TABLE 1

| Item | Country | Patent/Publication Number | Issue/Publication Date | Title |
|---|---|---|---|---|
| 1 | China | CN 103857196 A | Jun. 11, 2014 | Method for Optimizing Multi-Head Arch-type High Speed and High Precision Placing Machine in Offline Mode |
| 2 | China | CN 103717007 A | Apr. 9, 2014 | Multiple Suction Nozzle Placing Machine Optimization Method Based on Clustering Analysis and Genetic algorithm |
| 3 | China | CN 105120647 A | Dec. 2, 2015 | Placing Machine Production Data Optimization Method Based on Feeder Position |
| 4 | China | CN 102883548 B | Mar. 8, 2015 | Component Mounting and Placing Optimization Method for Placing Machine Based on Quantum Neural Network |
| 5 | China | CN 103729699 A | Apr. 16, 2014 | Components Placing Data Optimization Method Based On Cluster Analysis Algorithm |
| 6 | China | CN 104200316 A | Dec. 10, 2014 | SMT Closed-Loop Integrated Optimization System and Method Thereof |

Item 1 above provides a placement optimization method for a placement machine. The document took into account nozzle assignment, feeder assignment, and pick-and-place (PAP) sequence scheduling, but did not consider nozzle replacement and simultaneous pickup of components, whereas these two problems often constitute the major bottleneck of the overall efficiency of the beam-type surface mounter. Item 2 above provides a placement optimization method for the surface mounter, which also did not consider nozzle replacement. Item 3 provides a method for optimizing PAP sequences for a surface mounter. The document took into account the problem of simultaneous pickup, but did not mention nozzle assignment and feeder assignment. Item 4 provides an optimization method for a single-placement-head surface mounter. However, the technology disclosed in the document cannot be applied to the surface mounter with multiple placement heads. Item 5 provides an optimization method for the placement movements of different component types. Item 6 provides an optimized solution for the entire SMT production line. However, item 5 and 6 did not consider making the best use of the capabilities of an individual surface mounter.

Resolving optimization problems for a beam-type single-gantry surface mounter remains very challenging because it involves too many optimization objectives and relations between various optimization objectives are extremely complicated. As a result, there is still a lot of room for improvement in this area. The major problems in this area include:

(1) Lack of effective and comprehensive research framework, so that all optimization objectives cannot be accomplished at the same time.

Existing researches on the optimization of beam-type surface mounters applied the same research framework for other types of surface mounters, decomposing the optimization problem into feeder assignment and PAP sequence problems. In fact, the optimization method for other types of surface mounters does not apply to the beam-type surface mounters. This is because optimization methods for other types of surface mounters do not consider minimization of the number of nozzle replacements, and maximization of the number of components which may be picked up at one time.

(2) The published studies directly use intelligent optimization algorithms, without sufficiently narrowing the search space by exploiting the expert knowledge. As such, optimization processes will take a very long time to complete with instable or non-unique optimization results.

In order to resolve the optimization problems of pick-and-place process and the related sub-problems, heuristic search method or meta-heuristic search method may be adopted. Such optimization processes tend to be random, and the optimization results are often not satisfactory due to lack of sufficient expert guidance to narrow the relevant search area. The problems may be described in the following two points:

(2-1) very low optimization efficiency and very long optimization time; and (2-2) instable or non-unique optimization results. The results may be different even when the same production parameters are utilized.

SUMMARY OF THE PRESENT INVENTION

Certain variations of the present invention provide a "pick-and-place process optimization method" which may be implemented by programming to obtain a pick-and-place process optimization software. The output results after running the pick-and-place process optimization software becomes the solution of the pick-and-place optimization process. The key to the pick-and-place optimization process is the placement heads tasks assignment. In the following, 'placement heads' may be also abbreviated as 'heads'. Through heads tasks assignment, nozzles installed on each head and the types of components to be picked up by each head in each pick-and-place cycle will be obtained, while feeders will be appropriately grouped, achieving the following goals: minimization of the number of pick-and-place cycles, minimization of the number of nozzle replacements, minimization of the number of trips between auto nozzle changer (ANC), and maximization of number of simultaneous pickup of components.

The objectives of the present invention may be summarized as:

(1) The present invention provides an optimization approach for placement heads tasks assignment of beam-type single-gantry surface mounters. The method constructs a comprehensive and effective research framework, wherein the research framework can take into consideration and balance various optimization objectives for pick-and-place processes, thereby maximizing the efficiency thereof. The various optimization objectives include minimization of the number of pick-and-place cycles, minimization of the number of nozzle replacements, minimization of the number of trips between auto nozzle changer (ANC), and maximization of number of simultaneous pickup of components.

(2) The present invention also provides an efficient and reliable solution for each of the sub-problems identified above. The sub-problems include: nozzle assignment problem and components allocation problem. The present invention utilizes expert knowledge to sufficiently narrow the search area, shorten the time for carrying out optimization algorithm, and to produce stable and unique optimization results when identical production data are used.

The advantageous effects of the present invention may be described as follows:

The present invention provides an optimization approach for placement heads tasks assignment of beam-type single-gantry surface mounters, wherein the placement heads tasks assignment method establishes a complete and effective research framework for optimizing all the optimization goals for pick-and-place processes so as to maximize the efficiency thereof. The present invention utilizes expert knowledge in narrowing down searching space, and providing a time-efficient and stable optimization result. Test results reveal that the present invention is capable of dramatically improving the overall production efficiency of beam-type single-gantry surface mounters. The increase in overall production efficiency can be as high as 20.9%. The optimization method provided by the invention is completely valid and can rapidly generates stable optimization solutions. Moreover, the optimization method may easily be expanded for use in surface mounters with similar mechanical structure.

Specifically, the present invention provides the following four inventive concepts: (1) the present invention employs a more comprehensive optimization goal, and provides a completely new and effective research framework, which can balance various optimization sub-goals, thereby maximizing the efficiency of the overall pick-and-place processes. The optimization method provided by the present invention adopts a problem decomposition strategy different from that of existing researches. The main optimization problem is decomposed into the "placement heads tasks assignment" subproblem and "pick-and-place sequence scheduling" subproblem. The "placement heads tasks assignment" subproblem will assign pick-and-place tasks on each placement head in each pick-and-place cycle. More specifically, the above-mentioned "placement heads tasks assignment" sub-problem includes "nozzle assignment" problem, "nozzle assignment exchange" problem, and "component allocation" problem. The solution of the "nozzle assignment" problem will determine the type of nozzle installed on each head in each pick-and-place cycle. The "nozzle assignment" optimization minimizes the number of pick-and-place cycles, minimizes the number of nozzle replacements, and minimizes the number of trips between ANC. The "nozzle assignment exchange" increases the diversity of "component allocation" so as to increase the number of simultaneous pickups. The solution of "component allocation" gives the component type to be picked and placed by each head per PAP cycle, and the grouping of feeders realizing the maximization the simultaneous pickups. "Component allocation" maximizes the number of components that can be simultaneously picked up per PAP cycle. (2) The present invention provides a reliable and efficient "nozzle assignment" method which may minimize the number of pick-and-place cycles, nozzle replacements, and trips between auto nozzle changer. (3) The present invention provides a reliable and efficient "component allocation" method. The newly presented concepts of "nozzle assignment exchange" and "feeder grouping" help to bridge the "nozzle assignment", "component allocation" and "pick-and-place sequence scheduling". "Component allocation" realizes allocating multiple feeders for one component type, allocating feeders that occupies multiple feeder slots, and maximizing simultaneous pickups of multiple intervals, which has not been reported by any existing researches yet. (4) Expert knowledge is sufficiently exploited for narrowing the search space, minimizing the search time of optimization algorithms and achieving a unique and stable optimization result. "Placement heads tasks assignment" assigns the tasks for each placement head per pick-and-place cycle, which will also limit the searching space for "pick-and-place sequence scheduling", ending up with an overall improved optimization algorithm.

The present invention provides an optimization approach for placement heads tasks assignment of beam-type single-gantry surface mounters, comprising the steps of (a) importing user-defined production parameters and forming raw production data for beam-type single-gantry surface mounters;

(b) pre-processing the raw production data and obtaining the intermediate production data that facilitates the subsequent processing;

(c) verifying the loop condition of the "placement heads tasks assignment", that is, looping through all the nozzle assignment possibilities by setting nozzle-tasks limit as the loop variable, and verifying whether the nozzle-tasks limit reaches its maximum, if yes, some nozzle assignment possibilities has yet to be examined and searching continue according to step (d) to step (g) below, if not, optimal nozzle assignment has been reached and searching may stop and carry out step (h);

(d) performing nozzle assignment according to "raw nozzle number", "raw nozzle placement quantity", and "nozzle-tasks limit" in intermediate production data to obtain a nozzle assignment result, namely the optimal nozzle type selection for each head per pick-and-place cycle;

(e) confirming all the nozzle assignment exchange possibilities;

(f) verifying whether the loop condition of "component allocation" are fulfilled, if yes, carry out step (g), if not, carry out step (c);

(g) performing component allocation, wherein exchanging the nozzle assignment results between the placement heads according to the possibilities confirmed in (e), and allocating component type corresponding to the exchanged nozzle assignment, to obtain a component allocation result, namely the optimal component type allocation for each head per pick-and-place cycle, together with the assigned feeder groups, whereafter evaluating the component allocation results by the cost function, and when the current cost function is superior to the previous best cost function, performing the following replace operations, namely replacing the previous best component allocation results by the current component allocation results, replacing the previous best nozzle assignment results by the current nozzle assignment results, and replacing the previous best cost function by the current cost function; ending up with returning to (f);

(h) outputting the optimal placement heads tasks assignment results.

This summary presented above is provided merely to introduce certain concepts and not to identify any key or essential features of the claimed subject matter.

DETAILED DESCRIPTION OF THE PREFERRED EMBODIMENT

The following detailed description of the preferred embodiment is the preferred mode of carrying out the invention. The description is not to be taken in any limiting sense. It is presented for the purpose of illustrating the general principles of the present invention.

Figure 1:
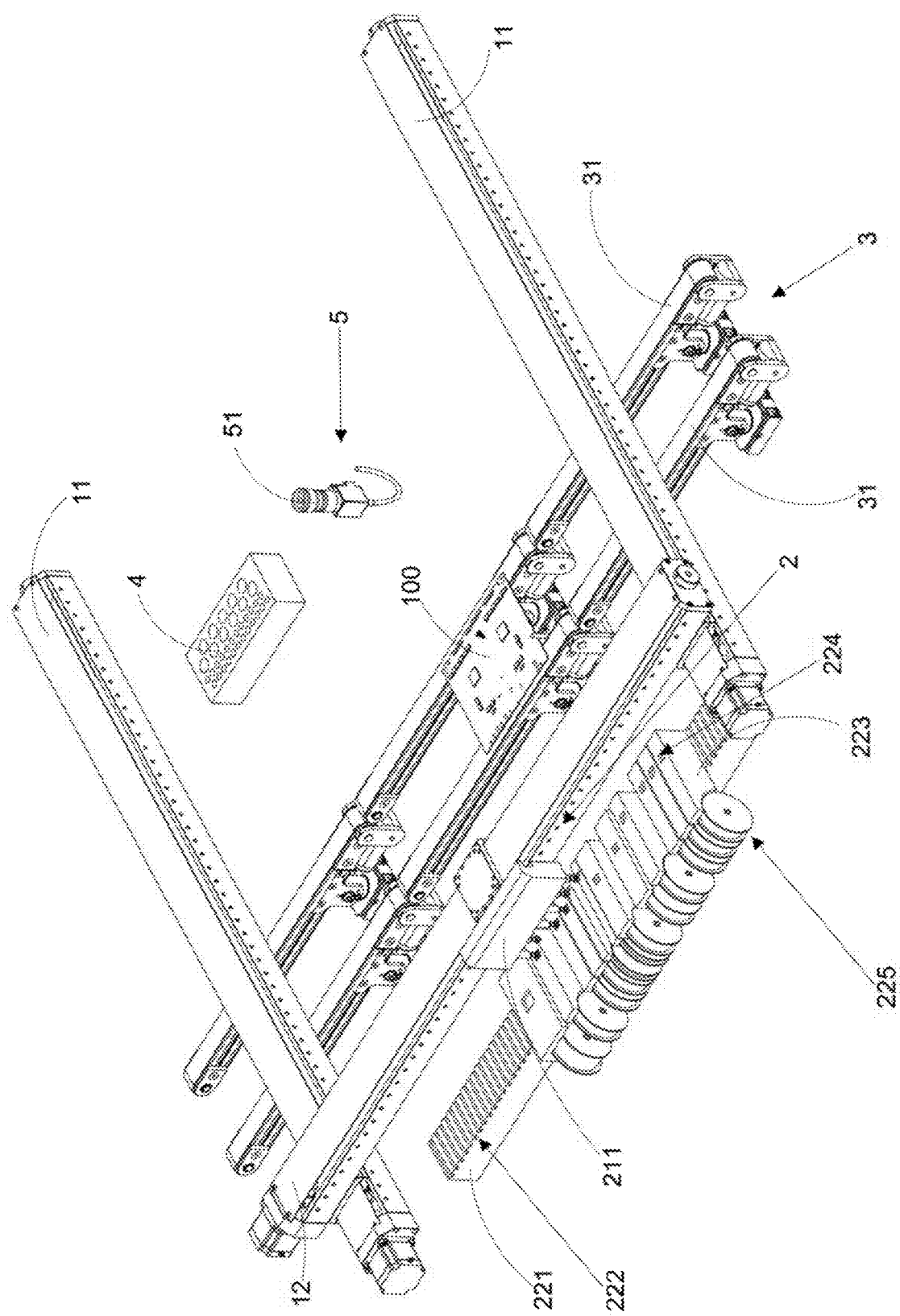
FIG. 1 is a schematic diagram of a beam-type single-gantry surface mounter performing the picking action according to a preferred embodiment of the present invention.

Referring to FIG. 1 to FIG. 6, FIG. 7A to FIG. 7D, FIG. 8A to FIG. 8D, and FIG. 9 to FIG. 11 of the drawings, a beam-type single-gantry surface mounter according to a preferred embodiment of the present invention is illustrated. FIG. 1 schematically illustrates the major components of the beam-type single-gantry surface mounter. Broadly, the beam-type single-gantry surface mounter may comprise a main supporting frame which provides a three-axis movement platform. The beam-type single-gantry surface mounter may comprise a transmission mechanism 1, a components pickup and supply arrangement 2, a components placement mechanism 3, an auto nozzle changer 4, and an image capturing arrangement 5.

The transmission mechanism comprises a pair of linear guideways 11 arranged in parallel with each other, and a gantry 12 transversely extended across the linear guideways. The gantry 12 is arranged to move along the axial direction of the linear guideways, which is actuated by at least one motor. For the sake of convenience, the axial direction of linear guideways 11 may be designated as Y-axis direction. In this preferred embodiment, the motor corresponding to the linear guideway 11 is Y-axis motor, which drives the gantry 12 to move along the direction of Y-axis. The motor installed on the gantry 12 is X-axis motor, which drives the head assembly to move along the direction of X-axis. The present invention relates only to the surface mounter which comprises a single gantry 12 and a beam-type head assembly.

Figure 2:
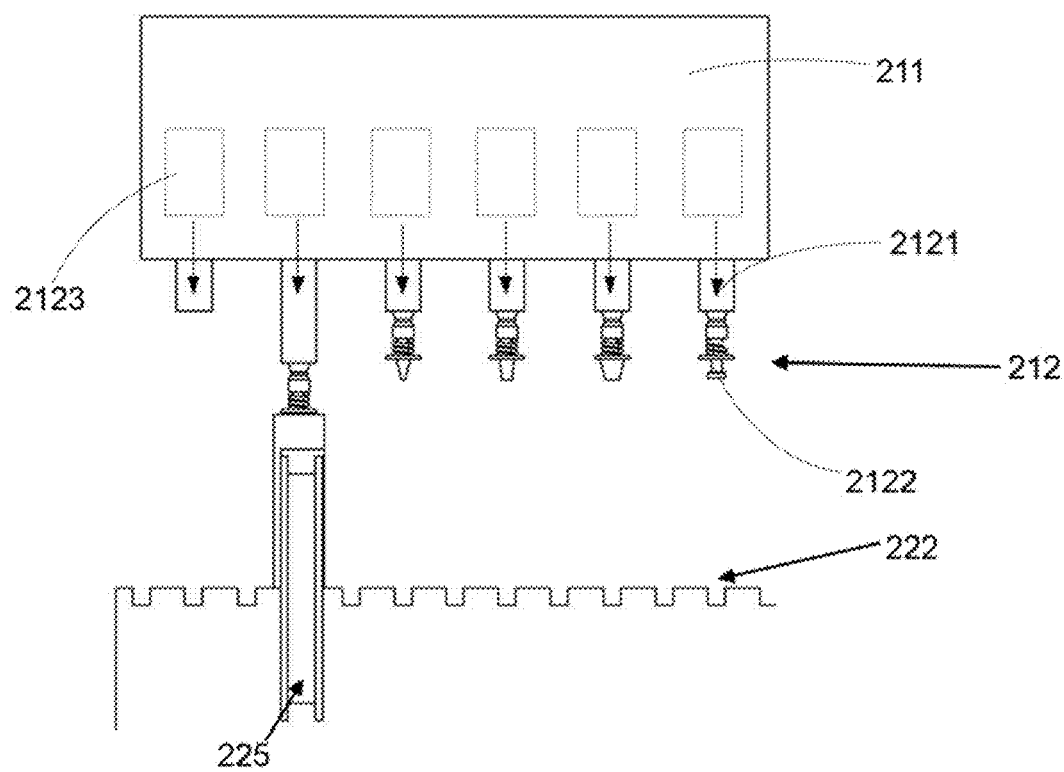
FIG. 2 is a schematic diagram of the placement heads assembly of a beam-type single-gantry surface mounter according to a preferred embodiment of the present invention.

Referring to FIG. 1 to FIG. 2 of the drawings, the surface mounter of the present invention utilizes one head assembly 211 and a plurality of suction assemblies 212 supported by the head assembly 211, wherein the suction assemblies 212 are sequentially arranged on a beam. This type of head assembly is named as beam-type head assembly, which is in contrast to head assemblies with suction assemblies arranged on a rotatory wheel or a turret. This configuration of the present invention will be described in more details below.

The suction assemblies 212 may be movably mounted on the head assembly 211 so that each of the suction assemblies 212 may move along a direction of Z-axis vertical to the head assembly 211. Thus, each of the suction assemblies 212 may move in an upward or downward direction with respect to the head assembly 211. The movement may be actuated by a motor. Moreover, each of the suction assemblies 212 may rotate about Z-axis (i.e. their respect longitudinal axis). This rotation may be termed "R-axis movement". The rotation is actuated by motor, which may be termed R-axis motor.

Thus, the components pickup and supply arrangement 2 comprises the components' pickup device 21 and the components' feeding device 22. The components' pickup device 21 comprises a head assembly 211, a plurality of suction assemblies 212. Each suction assembly 212 comprises a placement head 2121 and a nozzle 2122 provided on a free end of the placement head 2121. Each of the placement head 2121 has a hollow structure and communicates with a vacuum pump 2123. The vacuum pump 2123 is arranged to provide suction power for the corresponding nozzle 2122 while picking up electronic components. As shown in FIG. 2 of the drawings, each of the placement head 2121 may be equipped with a different nozzle 2122 for picking or sucking different types of electronic components. It is worth mentioning that the size of the free end of each suction nozzle type may be different. The larger the free end of the nozzle 2122, the larger the corresponding inner diameter thereof, and the larger the suction force. Larger suction force may be utilized to pick or suck electronic components having larger sizes and greater weight. The types of nozzles 2122 can be very diverse, and there may be more than twenty types of suction nozzles. The suction nozzles are also referred to as "nozzles" in the present invention.

The components' feeding device 22 may be utilized to feed electronic components to the components' pickup device 21. The components' feeding device 22 may work with standardized mechanical interface (such as a standard feeder slot) to be fixed to a feeder frame 221. The feeder frame 221 of the components' feeding device 22 is stationary. This configuration is in contrast with some surface mounters having movable feeder frames.

An operator of the present invention may stand on the outer side of the feeder frame 221 and face the surface mounter of the present invention. At this time, the left and right sides of the operator may be referred to the left and right sides of the surface mounter respectively, and the front and rear side of the operator may be referred to as the front and rear sides of the surface mounter respectively. Referring to FIG. 2 of the drawings, the placement head 2121 and feeder slots 222 may be numbered in increasing order from left to right. In the example provided by the present invention, there are altogether six placement heads 2121 extended from the head assembly 211, and the corresponding index numbers of the placement heads 2121 may be represented by head #1 to head #6. Furthermore, there are altogether 60 feeder slots 222 formed on the feeder frame 221. The feeder slot index number may be represented by feeder slot #1 to feeder slot #60. Note that surface mounter of the present invention is not limited to the number of placement heads 2121 and the number of feeder slots 222 shown in the drawings.

The components' feeding device 22 may take one of the three types, namely, tape-type feeding device, tray-type feeding device, and tube-type feeding device. The allocation of feeder slots 222 of the latter two types of components' feeding device 22 may be performed manually by an operator. The feeder slot allocation problems in the pick-and-place optimization process described below refers to the tape-type feeding device.

Figure 3:
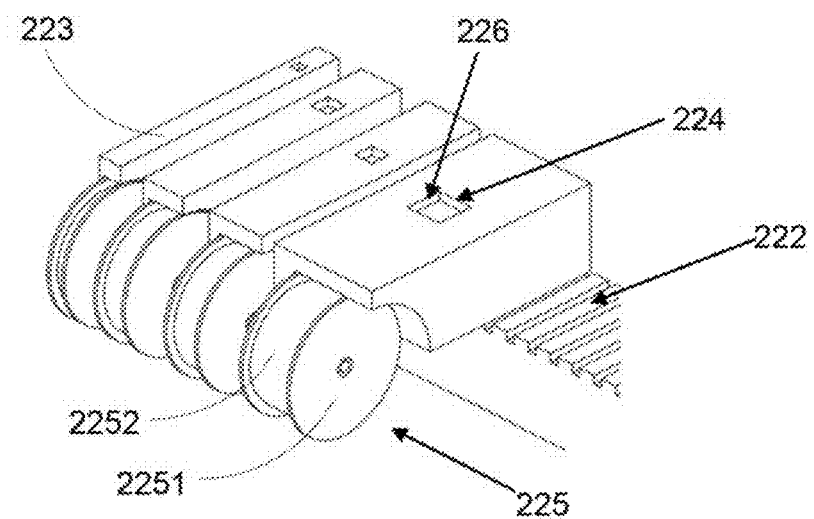
FIG. 3 is a schematic diagram of the components' feeding device of a beam-type single-gantry surface mounter according to a preferred embodiment of the present invention.

Referring to FIG. 3 of the drawings, the components' feeding device 22 comprises a plurality of feeders 223 supported by the feeder frame 221, wherein each of the feeders 223 has a feeder cavity 226 is formed therein, and a components' supply window 224 communicating the feeder cavity 226 with the components' pickup device 21. The components' feeding device 22 further comprises a plurality of tape packaging 225 mounted on the feeders 223 respectively, wherein each of the tape packaging 225 are arranged to carry electronic components to be fed to the components' pickup device 21. Each of the tape trays 225 comprises a transmission rotor 2251 and a components' carrying medium 2252 such as specifically designed adhesive tape movably supported in the feeder slot 222. The components' carrying medium 2252 is arranged to carry a plurality of electronic components in the feeder cavity 226 to align with the components' supply window 224. When an electronic component is picked up by the components' pickup device 21, the components' carrying medium 2252 may move to align the next electronic component with the components' supply window 224.

The components picking process is described as follows: the placement heads 2121 are driven to move to positions directly above the components' supply windows 224 of the components' feeding device 22 respectively. The placement heads 2121 are lowered until the nozzles 2122 touch the upper surface of the corresponding components respectively, and the vacuum pump 2123 are actuated to establishes a vacuum environment. The electronic components are attached to the nozzles 2122 and the heads 2121 are driven to move upwardly back to the original positions. The head #2 shown FIG. 2 of the drawings is picking up an electronic component from the components' supply window 224.

Figure 4:
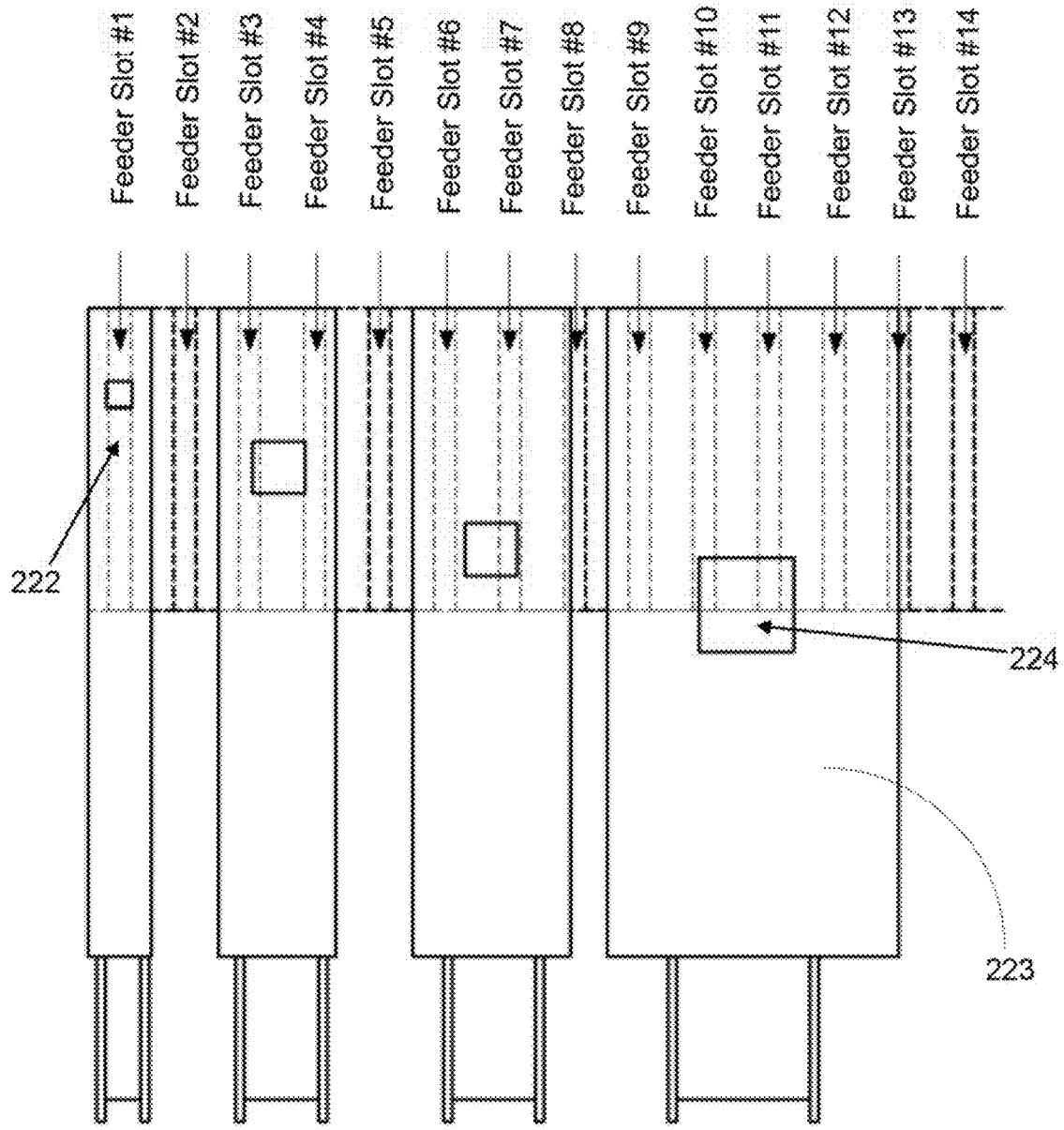
FIG. 4 is a schematic diagram depicting the relations between feeders and feeder slots according to a preferred embodiment of the present invention.

It is worth mentioning that different types of electronic components may have wide-ranging sizes, and feeders 223 of differing sizes or types may need to be utilized. FIG. 3 to FIG. 4 illustrate feeders 223 supporting four types of tape packaging 225. As shown in FIG. 3 to FIG. 4 of the drawings, the larger electronic components may need a larger tape packaging 225 and accordingly, a larger and wider components' carrying medium 2252. Furthermore, since the feeder 223 is larger in size, the number of feeder slots 222 that need to be occupied on the feeder frame 221 is also larger. The designation of feeder slot number may be defined as follows: the slot number assigned to a feeder 223 is the leftmost feeder slot number occupied by it, as shown in FIG. 4. Thus, the slot numbers of four different feeders 223 are feeder slot #1, feeder slot #3, feeder slot #6, feeder slot #9 respectively. In addition, the position of the components' supply windows 224 of different types of feeders 223 are also different. It is worth mentioning that there are more than twenty types of feeders 223.

In order to locate the position of the various components' supply windows 224, the present description defines X direction pickup offset and Y-direction pickup offset of the components' supply windows 224 from the leftmost side edge of the occupied feeder slot and the front edge of the feeder frame 221 respectively. Thus, a distance between the center of a components' supply window 224 and left side edge of the occupied feeder slot may be referred to as the X-direction pickup offset. Likewise, taking the front edge of the feeder frame 221 as a reference, a distance between a center of the components' supply window 224 and the front edge of the feeder frame 221 may be recorded as the Y-direction pickup offset.

Figure 5:
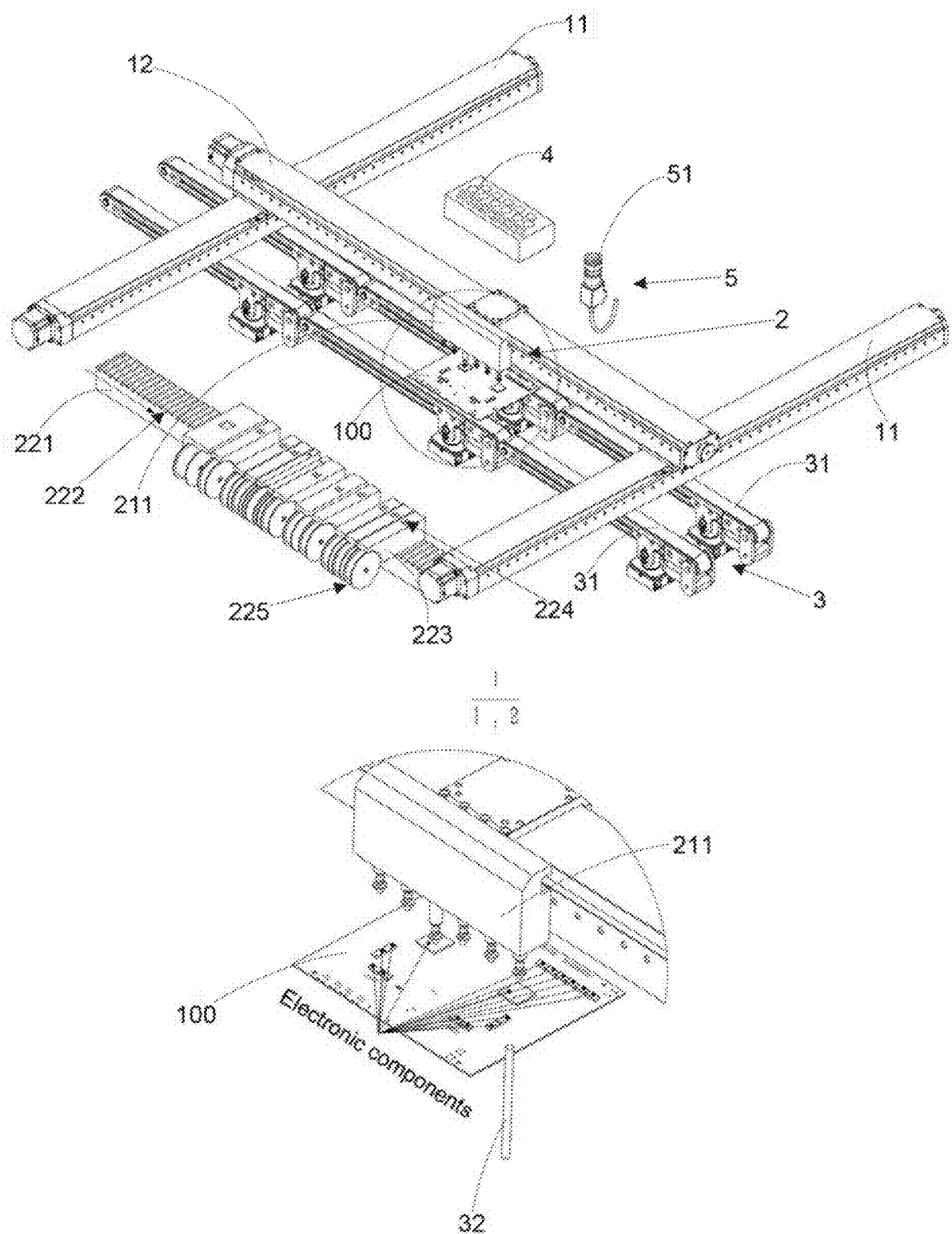
FIG. 5 is a schematic diagram of a beam-type single-gantry surface mounter performing the placing action according to a preferred embodiment of the present invention.

Referring to FIG. 5 of the drawings, it illustrates a Printed Circuit Board (PCB 100) transported to a predetermined position for placement of electronic components. Thus, the components placement mechanism 3 may comprise a plurality of conveyors belts 31 extended underneath the linear guideway 11 and the gantry 12 in a direction parallel to the gantry 12. The PCB 100 may be moveably supported by the conveyor belts 31, and a stopper 32 provided near the conveyor belts 31 for stopping further movement of the PCB 100 when the PCB 100 is transported by the conveyor belts 31.

The component placing process may be described as follows: the placement head 2121 that picks up the electronic component may move to an appropriate position, and may descend until the electronic component touches a top surface of the PCB 100. After this, the vacuum pump 2123 may exert blowing force to the corresponding electronic component. As a result, the component may be driven to push against the top surface of the PCB 100. Since the top surface of the PCB 100 is pre-coated with the adhesive agent, the component will be adhered to the corresponding position (a designated mounting spot or soldering spot) on the PCB 100. After that, the placement head 2121 may be driven to go up and move back to its original height. FIG. 5 illustrates an enlarged view of the PCB 100 which undergoes this component placing process. As shown in FIG. 5, the placing process of some electronic components has been completed on the PCB 100, and the placement head 2121 is being driven to undergo another component placing process.

Referring to FIG. 1 of the drawings, the auto nozzle changer 4 may comprise a station support 41 and a plurality of retention cavities 42 for accommodating the nozzles 2122 respectively. The nozzle 2122 replacement process may be described as follows: When a nozzle 2122 needs to be replaced, the nozzle 2122 may be driven to move with the head assembly 211 directly above a designated idle retention cavity 42 (idle means that there is no nozzle 2122 inside the retention cavity 42). The nozzle 2122 may then be inserted into the designated retention cavity 42, and a resilient mechanism may be provided in the retention cavity 42 for retaining the nozzle 2122 in the retention cavity 42. When the nozzle 2122 is removed, the placement head 2121 may be raised, and the placement head 2121 may be moved to the retention cavity 42 where the needed nozzle 2122 has already been retained. The placement head 2121 may then be lowered until the nozzle 2122 is attached on the placement head 2121. This completes the nozzle replacement process.

The image capturing arrangement 5 is utilized for inspecting and adjusting the pick-and-place process of electronic components. After an electronic components has been picked up by the nozzles 2122, the position of the corresponding electronic element will be slightly offset from the reference point (i.e. the center of the corresponding head 2121) when viewed from the bottom, and the electronic component will also be rotated (angle deflection) relative to the reference direction (X-axis positive direction). The image capturing arrangement 5 may be utilized to detect the above-mentioned position offset and angle deflection, so that the position offset and the angle deflection can be compensated or eliminated before the electronic component is placed on the PCB 100, thus achieving high-precision placement.

The image capturing arrangement 5 may comprise a stationary camera 51 securely supported by the feeder frame 221 for capturing a visual image of the electronic components. The stationary camera 51 may be configured to have a wider field of view that can be used for capturing images of electronic components of special shape or large sizes.

The image capturing arrangement 5 may further comprise an accompanying camera 52 supported on the head assembly 211 for capturing images of electronic components while the head assembly 211 is moving. The accompanying camera 52 may have a narrower field of view but may capture images of the electronic components while the placement head 211 is moving. Thus, the provision of the accompanying camera 52 may avoid moving the placement head 211 to align with the stationary camera 51 so as to make the entire pick-and-place process to be more efficient. Note that the beam-type single-gantry surface mounters of the present invention may be equipped with either the stationary camera 51, or the accompanying camera 52, or both. After the electronic components are picked up and before placement, the image of the electronic component on each placement head 2121 is captured by the corresponding stationary camera 51 or the accompanying camera 52.

The pick-and-place process of the beam-type single-gantry surface mounters of the present invention may be described as follows: first we define "pick-and-place cycle". The pick-and-place process of the electronic components may comprise several pick-and-place cycles. Each pick-and-place cycle may comprise two separate steps, the first being a picking step in which the placement heads 2121 on the head assembly 211 have picked the electronic components from the components' feeding device 22, the second being a placing step in which the placement heads 2121 have finished placing the electronic components on the designated spots on the PCB 100.

Note that one should not be confused by the above definitions. The picking step includes the picking action of the placement heads 2121 while the placing step includes the placing action of each of the placement heads 2121. The picking step and the placing step constitute the pick-and-place cycle, while pick-and-place process contains multiple pick-and-place cycle.

Figure 6:
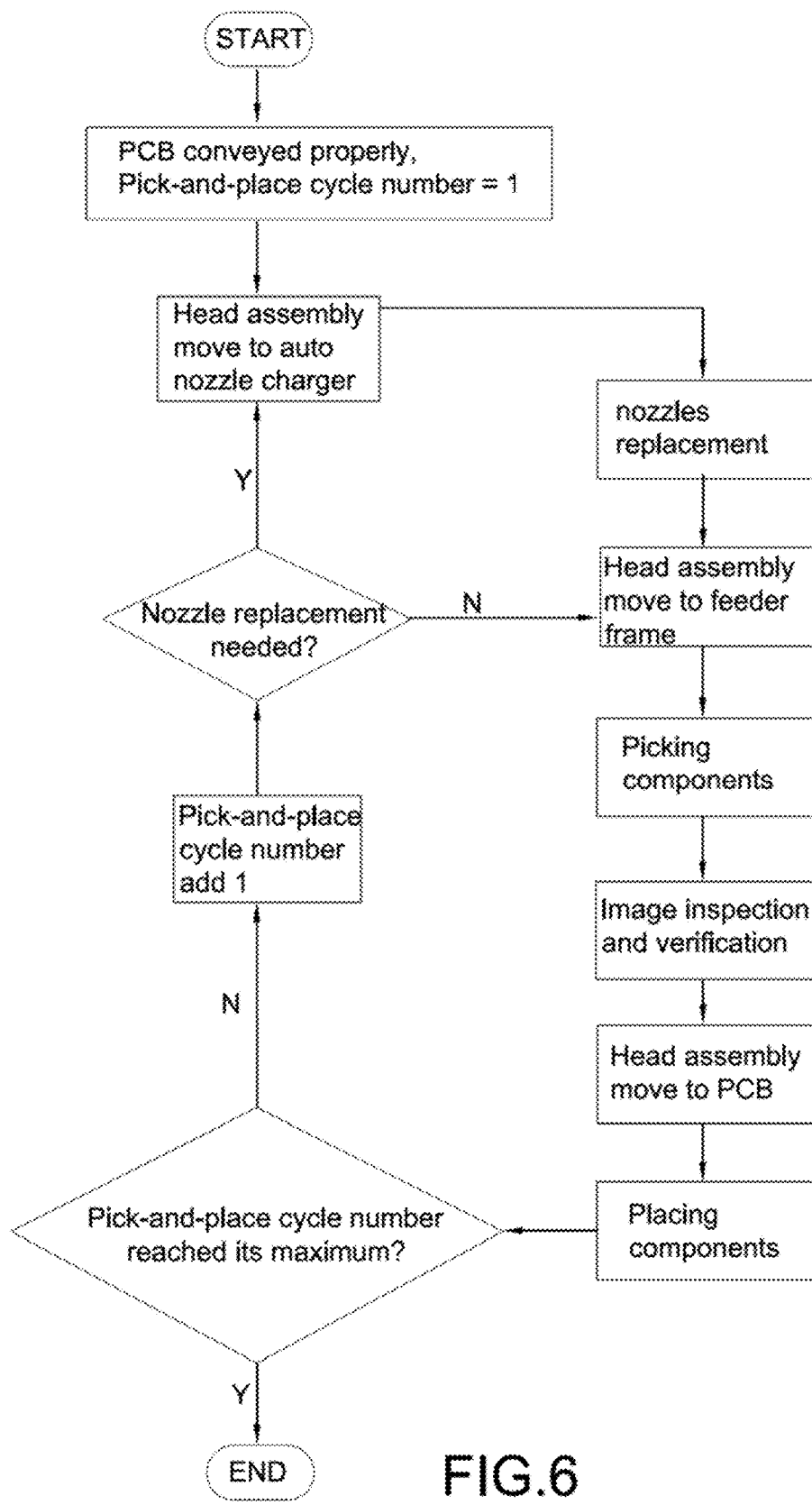
FIG. 6 is a flow chart of the pick-and-place process of the beam-type single-gantry surface mounter according to a preferred embodiment of the present invention.

Referring to FIG. 6 of the drawings, a flow diagram of the pick-and-place cycle is illustrated. The pick-and-place cycle of the beam-type single-gantry surface mounters may be described as follows:

Step 1: a sensor detects if a PCB 100 has been conveyed and is fixed in a designated location for components placement. If yes, the pick-and-place cycle count variable is set to 1, and go to step 2. If not, remain in step 1.

Step 2: determine whether or not any nozzle 2122 needs to be replaced to complete the current pick-and-place cycle. If replacement of nozzles 2122 is required, the head assembly 211 will be driven to move to the auto nozzle changer 4 for replacement of the nozzles 2122 on the corresponding placement heads 2121. Then perform nozzle replacement and directly go to step 3. If replacement of nozzles 2122 is not required, also go to step 3.

Step 3: the head assembly 211 moves over the components' feeding device 22, so that the placement heads 2121 may sequentially move to the corresponding components' supply window 224 and pick the corresponding electronic components to complete the picking step of a pick-and-place cycle.

Step 4: perform image inspection on the electronic components picked by the nozzles 2122 by the image capturing arrangement 5, and calculate the corresponding angle deflection value and rotate the corresponding placement heads 2121 to eliminate the angle deflection, and calculate the position offset value and perform position compensation for each of the electronic components.

Step 5: move the head assembly 211 so as to allow each of the placement head 2121 to move over the designated mounting spots on the PCB 100 for performing the placing step.

Step 6: determine whether or not the current pick-and-place cycle count variable is greater than the total number of pick-and-place cycles. If yes, the PCB 100 will be transported to the next manufacturing station by the conveyor belts 31 and return to step 1. If not, the pickup cycle count variable will be added 1, and return to step 2.

Remarks: a complete pick-and-place cycle may sequentially carry out step 2 to step 5 described above.

The output result obtained by running the pick-and-place process optimization software is the solution result of the pick-and-place process optimization problem, and the solution result includes the assignment of feeders 223 to feeder slots 222, the type of the nozzles 2122 installed on each placement head 2121 in each pick-and-place cycle, picking coordinates and picking order of each placement head 2121 in each pick-and-place cycle, and placing coordinates and placing order of the electronic components. After proper planning, the following parameters for each pick-and-place cycle can be determined:

(1) the type of nozzles 2122 on each placement head 2121;

(2) the designated serial number of each electronic component on each placement head 2121. The serial number is the sequence number of the electronic component imported form the PCB data file. The data stored in the "PCB data file" includes the following information: component serial number, component type name, X coordinate of the component, and Y coordinate of the component. An example is shown in Table 2 below:

TABLE 2

| Serial No. | Component type | X-coordinate | Y-coordinate |
| --- | --- | --- | --- |
| 1 | TR2_TO252 | 38.56 | 78.74 |
| ... | ... | ... | ... |

(3) The slot number of the feeder frame 221 for all feeders 223.

(4) the sequence of picking electronic components for all heads 2121.

(5) the sequence of placing electronic components for all heads 2121.

In the following descriptions, we define the coordinates of the head assembly 211 in X-Y plane as the coordinates of the head #1 vertically projecting on the X-Y plane. Define the picking coordinates of a head 2121 as the coordinates of the head assembly 211 after this head 2121 reaching the center of a corresponding components' supply window 224.

The purpose of the pick-and-place optimization process of the beam-type single-gantry surface mounter of the present invention is to maximize the efficiency of PCB pick-and-place assembly. In order to achieve this goal, comprehensive analysis of production data should be carried out on the one hand, to complete assignment of tasks for placement heads 2121. On the other hand, the sequence of the picking and placement of electronic components should also be optimized.

Remarks: production data includes the quantities of available feeders 223 for various electronic components, the quantities of available nozzles 2122, the quantities of available placement heads 2121 and the corresponding placement head number that can participate in production, and the available feeder slots 222 and their corresponding number that can participate in production (some heads 2121 or feeder slots 222 may not participate in particular production cycles due to malfunctions, etc.)

At present, most of the researches on the optimization of the pick-and-place processes of the surface mounters have focused on the problems of feeder slots allocation and components' pick-and-place sequence. Feeder slots allocation problems are often viewed as quadratic assignment problem, while the components pick-and-place sequence scheduling problem is often considered as travelling salesman problems (TSP). The quadratic assignment problem and the travelling salesman problem belong to the NP-hard combinatorial optimization problem without polynomial time solution. When a large number of optimization variables are involved, the optimal solution cannot be obtained in a finite time. Therefore, most of the relevant literatures adopt heuristic search algorithm to obtain a suboptimal solution.

The optimization problem of the pick-and-place process of a surface mounter is very complicated. The performance of different pick-and-place process optimization methods varies a lot. Utilizing a better optimization approach, the production time consumed for assembling the same PCB using the same surface mounter can be improved by few or even tens of percent. Specifically, the complexity of solving this optimization problem may be reflected in:

(1) The optimization involves too many optimization variables. The production data of different batches of PCB are different. There are many optimization variables to be considered in the optimization of the PAP processes. For example, there exist over hundreds different types of electronic components and more than twenty different types of nozzles 2122. Moreover, there are more than twenty different types of feeders 223, so that the algorithm design will become very complicated. If the underlying problem cannot be not fully simplified, the optimization searching process can be very time-consuming.

(2) It is very difficult to effectively split the problem into sub-problems. The optimization problem of an entire pick-and-place process can be decomposed into several sub-problems which may be solved one by one. In fact, there exist a high degree of correlation between each sub-problem. As a result, the solution scheme to each sub-problem will significant affect the overall solution of the entire pick-and-place process. For example, if the optimization method is decomposed into the two sub-problems of feeder slots allocation problem and pick-and-place sequence scheduling problem, some other optimization targets cannot be optimized in the same optimization algorithm. As a result, this particular decomposition strategy is not the best solution. The above-mentioned targets that cannot be optimized refer to minimization of the number of replacements of nozzles 2122 and the maximizing the number of simultaneous pickups of electronic components. These will be described in details below.

Compared with other types of surface mounters, the mechanical structure of the beam-type single-gantry surface mounter is rather unique, and the optimization of its pick-and-place process includes minimizing the number of nozzle replacements and maximizing the number of simultaneous pickups. These two goals substantially increase the difficulty of solving the overall optimization problems.

For the head assembly 211 as shown in the drawings, a interval between two adjacent heads 2121 is twice the interval between two adjacent feeder slots 222 (the interval between the two adjacent heads 2121 refers to the distance between the two longitudinal axis of the two heads 2121, while the interval between two adjacent feeder slots 222 refers to the distance between the leftmost side of two feeder slots 222. In the preferred embodiment of the present invention, the interval between two adjacent heads 2121 may be 30 mm, while the interval between two adjacent feeder slots 222 is 15 mm). The relationship of these two types of intervals allows electronic components to be picked up simultaneously by the head assembly 211. Simultaneous pickup means that when the head assembly 211 is about to pick up electronic components, and when there are at least two heads 2121 has the same picking coordinate, the heads 2121 with the same picking coordinate may simultaneously complete the picking action without having to complete picking of many electronic components one by one.

When two heads 2121 are simultaneously utilized to pick up electronic components, it may be referred to as two simultaneous pickups. When five heads are simultaneously utilized to pick up electronic components, it may be referred to as five simultaneous pickups, so on and so forth. Simultaneous pickup of electronic components by multiple heads 2121 can reduce the overall time taken for the picking process. If the number of simultaneous pickups is n, the time taken for performing n−1 picking action can be saved. To achieve simultaneous pickups of electronic components, the components' feeding device 22 needs to meet three requirements:

(1) the feeder slots 222 occupied by each feeder 223 must be the identical.

(2) X-direction pickup offset and Y-direction pickup offset of each feeder 223 must be identical.

(3) The distance between two corresponding feeder slots 222 of two adjacent feeders 223 is equal to a distance between two corresponding placement heads 2121 on the head assembly 211.

According to the number of feeder slots 222 and the corresponding pickup offset, we may categorize the electronic components into different simultaneous pickup types. The electronic components satisfying the above conditions (1) and (2) may be categorized as a same type of simultaneous pickup components.

Figure 7A:
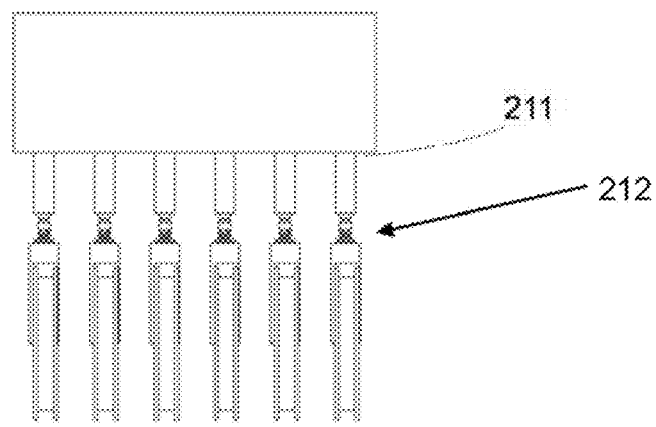
FIG. 7A is a schematic diagram depicting the front view of the head assembly performing zero-interval simultaneous pickup from feeders occupying one feeder slot according to the preferred embodiment of the present invention.
Figure 7B:
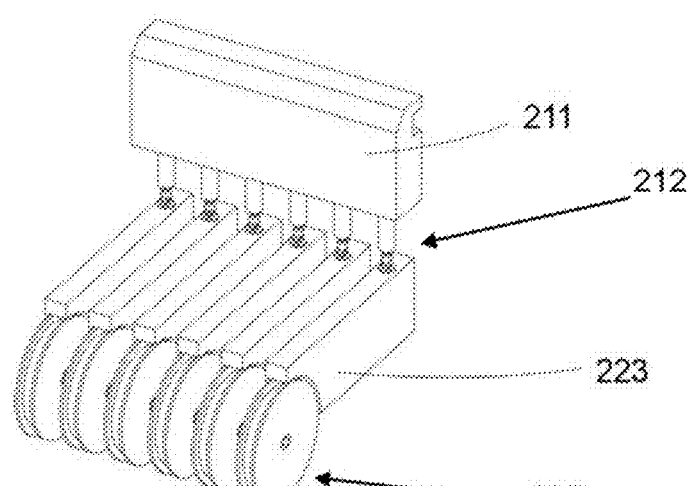
FIG. 7B is a schematic diagram depicting the side view of the head assembly performing zero-interval simultaneous pickup from feeders occupying one feeder slot according to the preferred embodiment of the present invention.
Figure 7C:
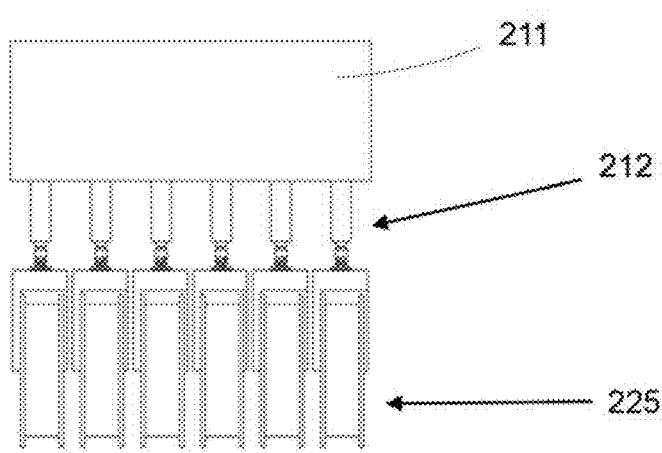
FIG. 7C is a schematic diagram depicting the front view of the head assembly performing zero-interval simultaneous pickup from feeders occupying two feeder slots according to the preferred embodiment of the present invention.
Figure 7D:
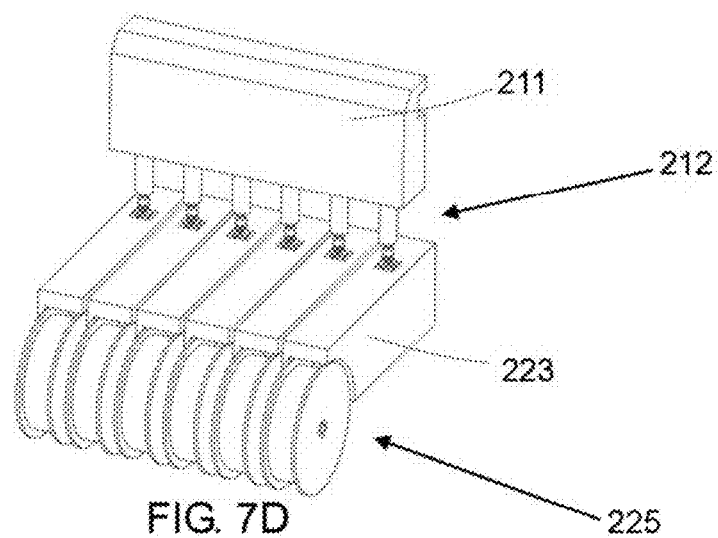
FIG. 7D is a schematic diagram depicting the side view of the head assembly performing zero-interval simultaneous pickup from feeders occupying two feeder slots according to the preferred embodiment of the present invention.

The minimum simultaneous pickup distance is defined as the minimal distance between heads 2121, when performing simultaneous pickup from a specific kind of feeder 223. These minimum simultaneous pickup distance help to distinguish components as zero-interval simultaneous pickup and multi-interval simultaneous pickup:

(1) Zero-interval simultaneous pickup: When a feeder 223 occupies less than 2 feeder slots 222, the head assembly 211 can simultaneously pick up a maximum of six electronic components. This situation may be referred to as zero-interval simultaneous pickup. A shown in FIG. 7A and FIG. 7B of the drawings, each feeder 223 occupies only one feeder slot 222. As shown in FIG. 7C and FIG. 7D of the drawings, each feeder 223 occupies two feeder slots 222. The situations illustrated in FIG. 7A to FIG. 7D of the drawings may accomplish simultaneous pickup of six electronic components.

Figure 8A:
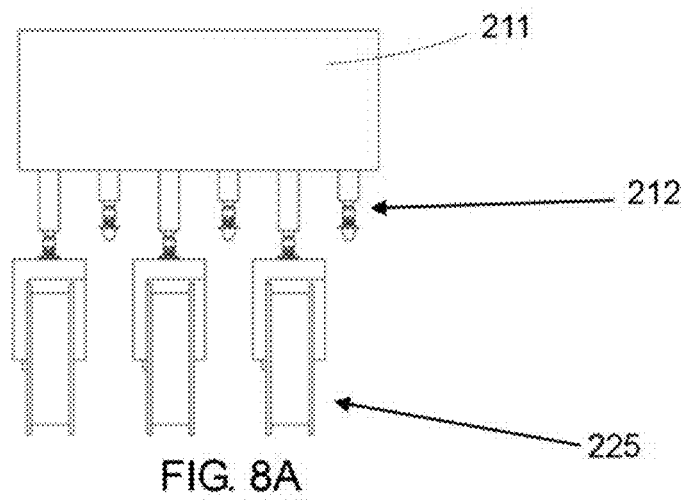
FIG. 8A is a schematic diagram depicting the front view of the head assembly performing multiple-interval simultaneous pickup from feeders occupying three feeder slots according to the preferred embodiment of the present invention.
Figure 8B:
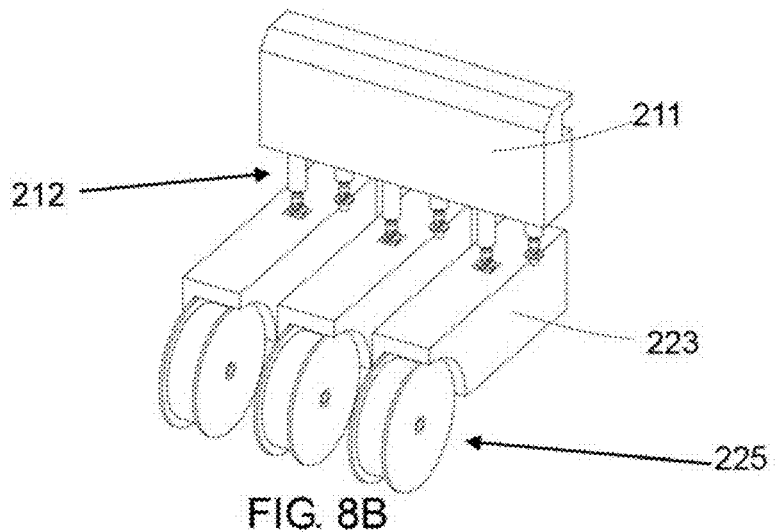
FIG. 8B is a schematic diagram depicting the side view of the head assembly performing multiple-interval simultaneous pickup from feeders occupying three feeder slots according to the preferred embodiment of the present invention.
Figure 8C:
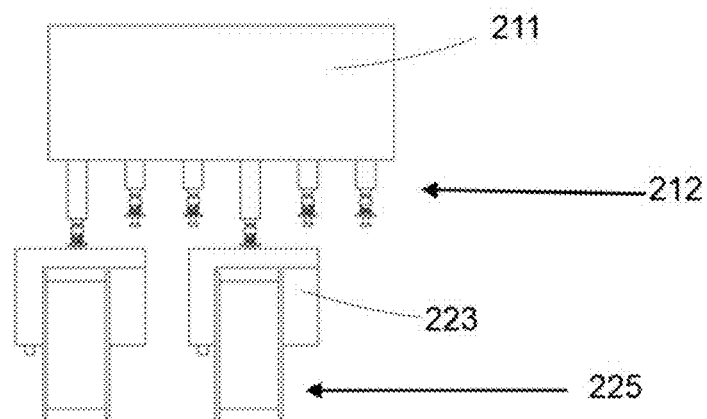
FIG. 8C is a schematic diagram depicting the front view of the head assembly performing multiple-interval simultaneous pickup from feeders occupying five feeder slots according to the preferred embodiment of the present invention.
Figure 8D:
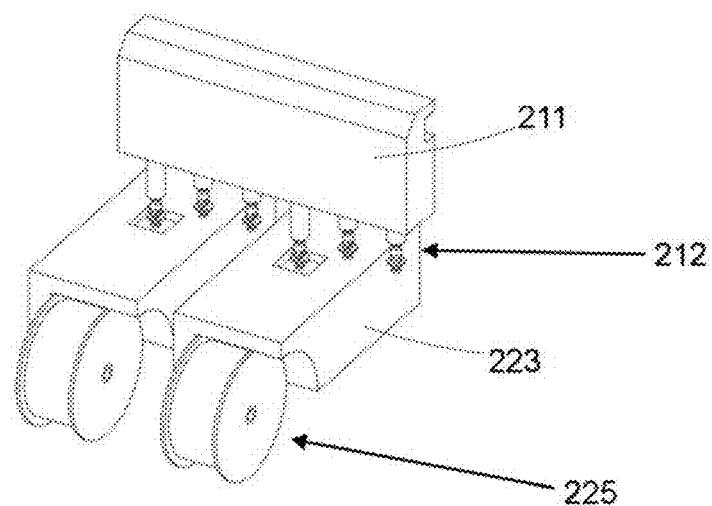
FIG. 8D is a schematic diagram depicting the side view of the head assembly performing multiple-interval simultaneous pickup from feeders occupying five feeder slots according to the preferred embodiment of the present invention.
Figure 9:
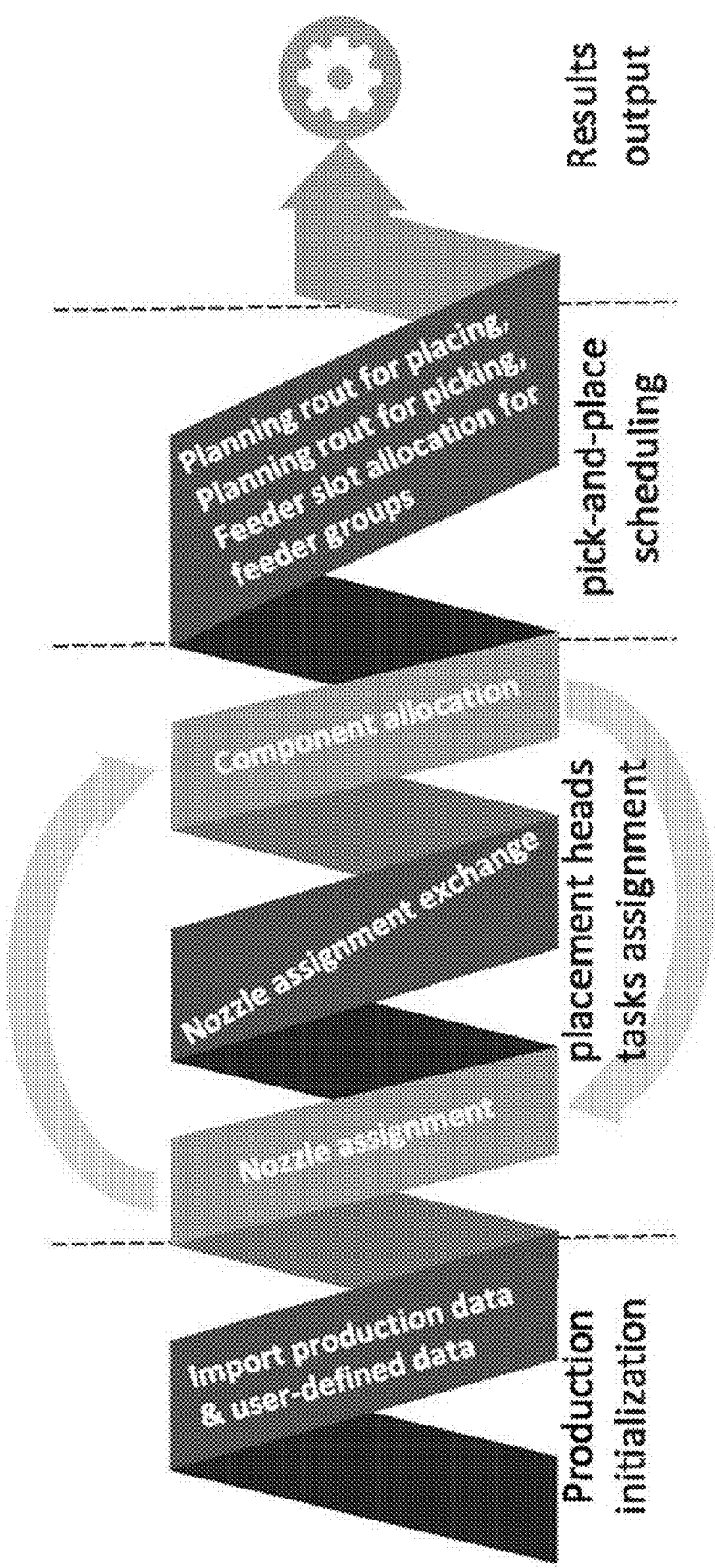
FIG. 9 is an optimization flow chart for the pick-and-place process according to the preferred embodiment of the present invention.

(2) Multiple-interval simultaneous pickup: when a feeder 223 occupies more than two feeder slots 222, due to the limitation of mechanical size (see FIG. 8A to FIG. 8B of the drawings), the maximum number of simultaneous pickups that can be accomplished will be no more than three. This situation may be referred to as multiple-interval simultaneous pickup. The feeder 223 as shown in FIG. 8A and FIG. 8B occupies three feeder slots 222, and the head assembly 211 can simultaneously pick up three electronic components. In this case, one head 2121 between two nearest heads 2121 performing multiple-interval simultaneous pickup will be idle. This situation may be referred to as one-interval three simultaneous pickup. The feeder 223 as shown in FIG. 8C and FIG. 8D occupies five feeder slots 222. The head assembly 211 can at most simultaneously pick up two electronic components. In this case, two heads 2121 between two nearest heads 2121 performing multiple-interval simultaneous pickup will be idle. This situation may be referred to as two-interval two simultaneous pickup.

Remarks: In the present invention, zero-interval simultaneous pickup and multiple-interval simultaneous pickup will both be maximized through nozzle assignment and component allocation.

It is worth mentioning that surface mounters other than beam-type single-gantry surface mounters do not concern with simultaneous pickup. For other types of surface mounters, in order to minimize pick-and-place distance, it is sufficient to assign each type of component with only one feeder, and compactly mount all feeders in the feeder slots closest to the PCB, which means that no idle feeder slot exists between two allocated feeders.

However, the beam-type single-gantry surface mounters of the present invention must consider the problem of maximizing the number of simultaneous pickups. With sufficient available feeders 223, simultaneous pickup can usually be maximized by properly allocating feeders 223 to the feeder slots 222, which will increase the search space of the feeder assignment problem. This reflects in two aspects: allocating multiple feeders 223 for each type of component, and idle feeder slots 222 may exist between assigned feeders 223.

The beam-type single-gantry surface mounters of the present invention must consider the problem of minimizing the number of nozzle 2122 replacements. The advantage of the beam-type single-gantry surface mounters is that it can assemble the most complete types of components onto a PCB, which also poses the nozzle replacement problem that is usually not considered by other types of surface mounters. To accommodate the components with various shapes and physical sizes, nozzles 2122 should inevitably be frequently replaced even during the assembly of a single PCB. For another, the beam-type single-gantry surface mounters employ beam-type head assembly 211, which has less placement heads 2121 (usually less than 10), comparing with turret-type surface mounters, due to the mechanical structure limitation. Therefore, it is often necessary to replace nozzles 2122, since a single type of nozzle 2122 cannot perform all pick-and-place tasks. In addition, appropriately performing nozzle replacement can also increase the number of simultaneous pickups by the heads 2121, and thus trade-off must be made between the two conflicting goals. For the above reasons, in a typical pick-and-place process, the beam-type head assembly 211 may move to the auto nozzle changer 4 very often for replacement of nozzles 2122. Each nozzle 2122 replacement may take considerable long time, which is about twice of a pick-and-place cycle. Therefore, minimizing the number of nozzle 2122 replacements is an important goal of the optimization process of the beam-type single-gantry surface mounters of the present invention, whereas most other types of surface mounters usually will not consider nozzle replacement process.

The present invention provides an optimization scheme for the pick-and-place process of the beam-type single-gantry surface mounters, which may be divided into two sub-problems, namely "placement heads tasks assignment problem" and "pick-and-place sequence scheduling problem", and provides the optimization approach for placement heads tasks assignment in detail. The output result of this placement heads tasks assignment method includes the type of the nozzle 2122 installed on each head 2121 per pick-and-place cycle, the type of the component picked and placed by each head 2121 per pick-and-place cycle, and the feeder groupings maximizing the simultaneous pickup. The output of the placement heads tasks assignment will be further used as the input of the "pick-and-place sequence scheduling". Based on the result of the placement heads tasks assignment, the "pick-and-place sequence scheduling" will further determine the allocated feeder slots 222 for each feeder groupings, picking coordinates and order as well as placement coordinates and order in each PAP cycle. The placement heads tasks assignment optimization achieves the following optimization goals: minimization of the number of pick-and-place cycles, minimization of the number of nozzle replacements, minimization of the number of trips between auto nozzle changer, and maximization of number of simultaneous pickup of components. "pick-and-place sequence scheduling" will further pursue the minimization of the pick-and-place path length. Comparing with the "pick-and-place sequence scheduling problem", the optimization of "placement heads tasks assignment problem" can bring about a more significant reduction in PCB assembly duration, which is therefore the core problem in the pick-and-place process optimization.

The beam-type single-gantry surface mounters of the present invention may have the following advantages compared to other types of surface mounters:

(1) The beam-type single-gantry surface mounter adopts a fixed feeder frame 221 and a fixed PCB mounting platform. The overall system structure is relatively simple, which guarantees higher placement precision.

(2) The beam-type single-gantry surface mounter is a multi-functional surface mounter for electronic components of various sizes and shapes. It can pick up and mount components of large size or special shape, which cannot be done using other types of surface mounters.

(3) The beam-type single-gantry surface mounter of the present invention may accomplish simultaneous pickup of electronic components. This significantly increases the efficiency of the overall pick-and-place process.

(4) The beam-type single-gantry surface mounter of the present invention is suitable for small or medium batch production of PCBs, and can also be used for mass production of PCBs when multiple machines are used, so that the beam-type single-gantry surface mounter can be used in a wide variety of circumstances. Because of these advantages, there exist great significance to optimize the beam-type single-gantry surface mounter in accordance with the above-mentioned optimization goals.

According to the preferred embodiment of the present invention, the optimization approach for placement heads tasks assignment of beam-type single-gantry surface mounters comprises the steps of:

(a) importing user-defined production parameters and forming raw production data for beam-type single-gantry surface mounters;

(b) pre-processing the raw production data and obtaining the intermediate production data that facilitates the subsequent processing;

(c) verifying the loop condition of the "placement heads tasks assignment", that is, looping through all the nozzle assignment possibilities by setting nozzle-tasks limit as the loop variable, and verifying whether the nozzle-tasks limit reaches its maximum, if yes, some nozzle assignment possibilities has yet to be examined and searching continue according to step (d) to step (g) below, if not, optimal nozzle assignment has been reached and searching may stop and carry out step (h);

(d) performing nozzle assignment according to "raw nozzle number", "raw nozzle placement quantity", and "nozzle-tasks limit" in intermediate production data to obtain a nozzle assignment result, namely the optimal nozzle type selection for each head per pick-and-place cycle;

(e) confirming all the nozzle assignment exchange possibilities;

(f) verifying whether the loop condition of "component allocation" are fulfilled, if yes, carry out step (g), if not, carry out step (c);

(g) performing component allocation, wherein exchanging the nozzle assignment results between the placement heads according to the possibilities confirmed in (e), and allocating component type corresponding to the exchanged nozzle assignment, to obtain a component assignment result, namely the optimal component type allocation for each head per pick-and-place cycle, together with the assigned feeder groupings, whereafter evaluating the component allocation results by the cost function, and when the current cost function is superior to the previous best cost function, performing the following replace operations, namely replacing the previous best component allocation results by the current component allocation results, replacing the previous best nozzle assignment results by the current nozzle allocation results, and replacing the previous best cost function by the current cost function; ending up with returning to (f);

(h) outputting the optimal placement heads tasks assignment results.

Remarks: the loop variable "nozzle-tasks limit" mentioned in step (c) is utilized in step (d) to ascertain the currently checking nozzle assignment possibility. The nozzle assignment possibility first determines nozzles assignment, which then determines component allocation for determining overall placement heads tasks assignment. The nozzle assignment possibility checked in this manner not only greatly reduces the searching space, but also ensures that the optimal assignment possibility will not be missed.

Step (a) comprises the steps of:

(a.1) executing the pick-and-place optimization software and initializing production data of the surface mounter;

(a.2) importing PCB data to the pick-and-place optimization software;

(a.3) setting user-defined data in the pick-and-place optimization software;

(a.4) clicking the run button displayed in the pick-and-place optimization software, which starts the optimization algorithm proposed in the present invention.

Step (b) through step (h) are automatically carried out by the pick-and-place optimization software and does not involve manual operations.

The production data of the beam-type single-gantry surface mounter includes production parameters of the automatic placement machine, data files for feeders 223 (feeder data file), and data files for electronic components (component data file).

Step (a.1) comprises the steps of:

(a.1.1) initializing the surface mounter's production parameters, including the total number of placement heads 2121, the total number of feeder slots 222, intervals between two adjacent heads 2121, intervals between each two adjacent feeder slots etc.; (for a given surface mounter, these production parameters are known and unchanged)

(a.1.2) automatically reading the data files for feeders 223 (see Table 4 below) and the data files for electronic components (see Table 5 below);

The data files for feeders 223 may include information regarding components feeder type, X-direction pickup offset, Y-direction pickup offset, and the number of feeder slots 222 occupied by each feeder 223.

The data files for electronic components may include information regarding the type of electronic components, the corresponding types of feeders, and the corresponding types of nozzles.

In step (a.2), the PCB production data may include component serial number, component type and mounting coordinates, etc. (see Table 3 below)

Step (a.3) comprises the steps of:

(a.3.1) setting inactive heads 2121 in pick-and-place process;

(a.3.2) setting inactive feeder slots 222 in pick-and-place process; and (a.3.3) setting the available number of feeders 223 for each type of electronic components and the available number of nozzles 2122 for each type of nozzles 2122.

In step (a.3.1), the heads 2121 are usually not disabled. Sometimes, however, individual heads cannot be used because of a mechanical or electrical malfunction. In this case, the faulty heads 2121 need to be set as unavailable, and the number of available heads should be updated.

In step (a.3.2), operators will assign slots for tray-type and tube-type feeders based on experience, and the slots occupied by these feeders are automatically identified as unavailable. Sometimes, individual feeder slots 222 are not available due to malfunctions. These feeder slots 222 need to be set as unavailable in this situation.

Step (b) comprises the steps of:

(b.1) processing the PCB data in PCB data file to obtain index relationship between components, feeders and nozzles;

(b.2) defining two row vectors of N elements, wherein one of the row vectors stores nozzle number as "raw nozzle number", while another one of the row vectors stores mounting quantities for each corresponding "raw nozzle number" and is named as "raw mounting quantities";

(b.3) counting simultaneous pickup types of corresponding electronic components for each nozzle number, for use in component allocation (see step (f.7) and step (g.1) below).

(b.4) calculating the minimum number of pick-and-place cycles $\underline{K}$; and (b.5) determining the variation range of "nozzle-tasks limit" cnt$\underline{K}$.

Step (b.1) comprises the step of counting the number of types of electronic components in the PCB data file (components having the same name should be regarded as the same type) to obtain a total number of components type C, and assigning each type of electronic components a component number $c \in \{1, 2, \ldots, C\}$ based on the corresponding sequence in PCB data file. The mounting quantities of each electronic component type is also called the mounting quantities of the corresponding component number. "Component c" refers to a particular type of electronic components to be placed.

The mounting quantities of a specific component number refer to the total number of mounting spots on the PCB for that particular type of electronic components.

Remarks: the PCB data file includes information of electronic components serial number, the type of electronic components, mounting spots' coordinates, etc. An example is shown in Table 3.

Based on information contained in PCB data file and component data file, information regarding the used nozzle types and index relationship between component c and nozzle $\beta(c)$ can be obtained. For example, the component name in the PCB data file listed in Table 3 can be used to link with the information contained in Table 5, namely the corresponding nozzle type and feeder type. Based on a descending order of the mounting quantities of each nozzle type, each nozzle type is assigned with a nozzle number as $n \in \{1, 2, \ldots, N\}$, where N is the total number of nozzle types, namely $\beta(c) \in \{1, 2, \ldots, N\}$. Note that the mounting quantities of each nozzle type is also the mounting quantities of each nozzle number. We may refer to "nozzle n" as an indication of a particular type of nozzles.

Remarks: one type of nozzle may be used for picking up different types of electronic components. The mounting quantities of a specific nozzle type refer to the sum of mounting quantities of the electronic components that can be picked up by this nozzle type.

Remarks: the component data file may contain information regarding the types of electronic components, the type of feeders for each type of components, and the types of nozzles for each type of components.

Based on the information in the PCB data file and component data file, one may obtain information regarding the used feeder types, and index relationship between component c and the corresponding feeder $\gamma(c)$. We may designate $f \in \{1, 2, \ldots, F\}$ as index number of feeders, where F is the total number of feeder types, and we have $\gamma(c) \in \{1, 2, \ldots, F\}$.

In step (b.2), two row vectors having N columns are defined, in which one of the row vectors stores "nozzle number", and called "raw nozzle number", wherein another row vector stores the mounting quantities of corresponding "raw nozzle number" and is called "raw mounting quantities", raw nozzle number is arranged and stored in ascending order. As the nozzle numbers is assigned according to the mounting quantities of the corresponding nozzle type in descending order, so that the "raw mounting quantities" is also sorted in descending order, guaranteeing that nozzle type with more mounting quantities has a higher priority.

Remarks: Raw nozzle number and raw mounting quantities are utilized in step (d.1) below to obtain the "group nozzle number" and the "group mounting quantities".

In step (b.3), the electronic components corresponding to nozzle numbers can be categorized, according to the types of simultaneous pickup. Take nozzle n for example, when nozzle n corresponds to Mn simultaneous pickup (SP, for short) type. The SP types are numbered in descending order of the mounting quantities of different SP types, which may be designated by $SPTn\_m \in (SPTn\_1, SPTn\_2, \ldots, SPTn\_Mn)$.

Remark: it can be known from the component data file that a particular type of nozzle may be used for picking and placing many electronic components, which, as can be known from the feeder data file, will be supplied by different types of feeders. Therefore, a particular nozzle type may be used to pick and place many different types of components that can be classified into different simultaneous pickup type.

Remarks: the mounting quantities of a specific SP type refer to the sum of the mounting quantities of the electronic components belonging to this SP type.

Step (b.4) comprises the step of dividing the total mounting quantities of all the components on the PCB by number of the available heads, and rounding up the result to obtain the minimum number of pick-and-place cycles $\underline{K}$.

In step (b.5), the minimum number of pick-and-place cycles $\underline{K}$ may minus an integer a1 to obtain the minimum value $\min \underline{K}$ of cnt$\underline{K}$. Similarly, K may add an integer a2 to obtain a maximum value $\max \underline{K}$ of cnt$\underline{K}$. Thus, $\min \underline{K} = \underline{K} - a1$ and $\max \underline{K} = \underline{K} + a2$.

Initialize the nozzle-tasks limit cnt$\underline{K}$ as cnt$\underline{K} = \min \underline{K} \cdot$ cnt$\underline{K}$ will be used for grouping the "group nozzle number" and "group mounting quantities" in step (d.1) mentioned below.

Remarks: as a loop variable in the loop condition of step (c), the "nozzle-tasks limit" cnt$\underline{K}$ ranges from $\min \underline{K}$ to max $\underline{K}$ and helps to process the "raw nozzle number" and "raw mounting quantities" forming different groups.

The greater the value of a1 and a2, the more nozzle assignment possibilities are searched, the more likely to find the optimal assignment results, whose drawback is taking a longer searching time. Experiments reveal that by setting a1=6 and a2=10, the optimal nozzles assignment results can be achieved in a reasonably short time.

In step (c), the loop conditions of the placement head task assignment may be carried out by determining whether or not cnt$\underline{K}$ is less than max$\underline{K}$. If yes, carry out step (d) to step (g). If not, go to step (h).

Step (d) comprises the steps of:

(d.1) defining two row vectors for each nozzle number, respectively containing the "group nozzle number" and "group mounting quantities";

(d.2) setting loop conditions for nozzles assignment; and (d.3) defining two row vectors for each nozzle number, the two row vectors being "regrouped nozzle number" and "regrouped mounting quantities" respectively. The regrouped nozzle number" and the "regrouped mounting quantities" are obtained from "group nozzle number" and "group mounting quantities" according to the last-column flag $EL_n$.

In step (d.1), the "group nozzle number" and "group mounting quantities" are obtained from "raw nozzle number", "raw mounting quantities" with the help of nozzle-tasks limit cntK. The procedures are as follows:

Take nozzle n as an example. Corresponding to nozzle n in "raw nozzle number", obtain the mounting quantity Pn of nozzle n from "raw mounting quantities", which can be divided by cnt$\underline{K}$ to get a quotient $d_1$ and remainder $d_2$. $d_1$ may be rounded up to get $\lceil d \rceil$ which is the number of columns of the two row vectors, "group nozzle number" and "group mounting quantities". Each column element of the "group nozzle number" of nozzle n is the corresponding nozzle number, which is n.

When $d_2$ equals to 0, the number stored on each column of the "group mounting quantities" becomes cnt$\underline{K}$. In this situation, the last column and last-column flag will not occur.

When $d_2 \neq 0$, the first $\lceil d_1 \rceil - 1$ columns of the "group mounting quantities" vector becomes cntK, while the $\lceil d_1 \rceil$ column stores $d_2$. The first $\lceil d_1 \rceil - 1$ columns may be called the "main column" of nozzle n and the $\lceil d_1 \rceil$ column is called the "last column" of nozzle n.

If nozzle n has a "last column", the last-column flag $EL_n$ (Boolean variable, either 0 or 1) may be defined for determining the sequence of last column of nozzle n in the "regrouped nozzle number" and "regrouped mounting quantities". The last-column flag $EL_n$ may be initialized as 0, n∈{1, 2, . . . , N}).

Step (d.1) also initialize the global optimal cost function value GbestE of the "placement head tasks assignment" as infinite inf.

Remarks: in step (g) below, GbestE may be used to determine whether different combinations of last-column flags of all the nozzles can lead to better assignment results.

Step (d.2) comprises the steps of determining whether or not all the last-column flags $EL_n$ are equal to 1. If not, initialize count variable of nozzle replacements V as 0, and initialize count variable of trips between auto nozzle changer W as 0, and go to step (d.3). If yes, update cnt$\underline{K}$=cnt$\underline{K}$+1 and go back to step (c). Note that n∈{1, 2, . . . , N} designates numbers of the nozzle types.

In step (d.3), for each nozzle number, define two row vectors, namely "regrouped nozzle number" and "regrouped mounting quantities". These two row vectors are obtained by rearranging the two row vectors "group nozzle number" and "group mounting quantities" according to last-column flag $EL_n$.

The two row vectors, namely "regrouped nozzle number" and "regrouped mounting quantities" may be obtained by the following steps:

(d.3.1) storing the main columns of all the nozzles into "regrouped nozzle number" and "regrouped mounting quantities" in ascending order of nozzle numbers respectively; and (d.3.2) adding the last column of all the nozzles into the "regrouped nozzle number" and "regrouped mounting quantities" according to last-column flag $EL_n$.

Figure 10:
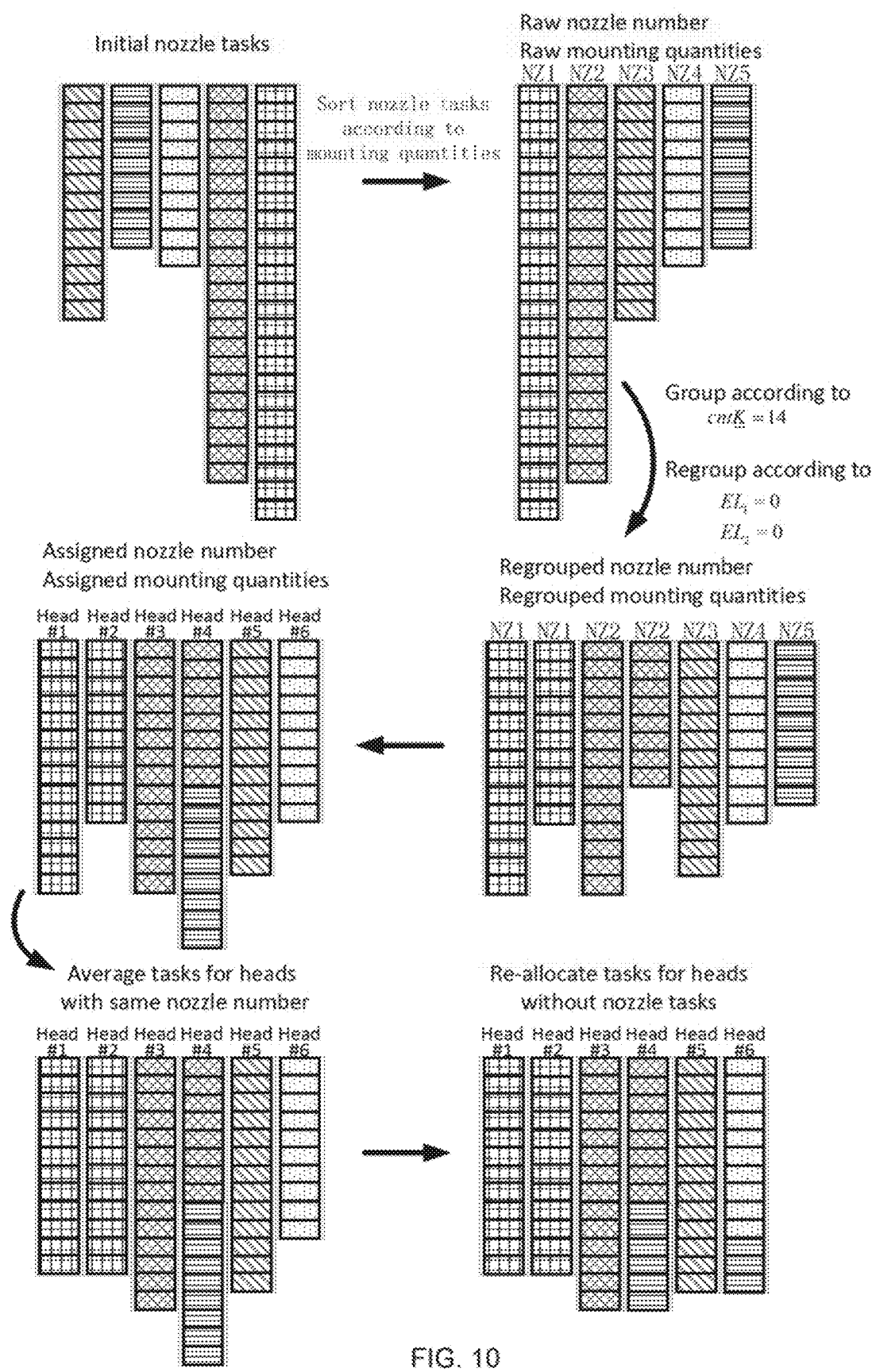
FIG. 10 is an optimization flow chart depicting nozzle assignment according to the preferred embodiment of the present invention.
Figure 11:
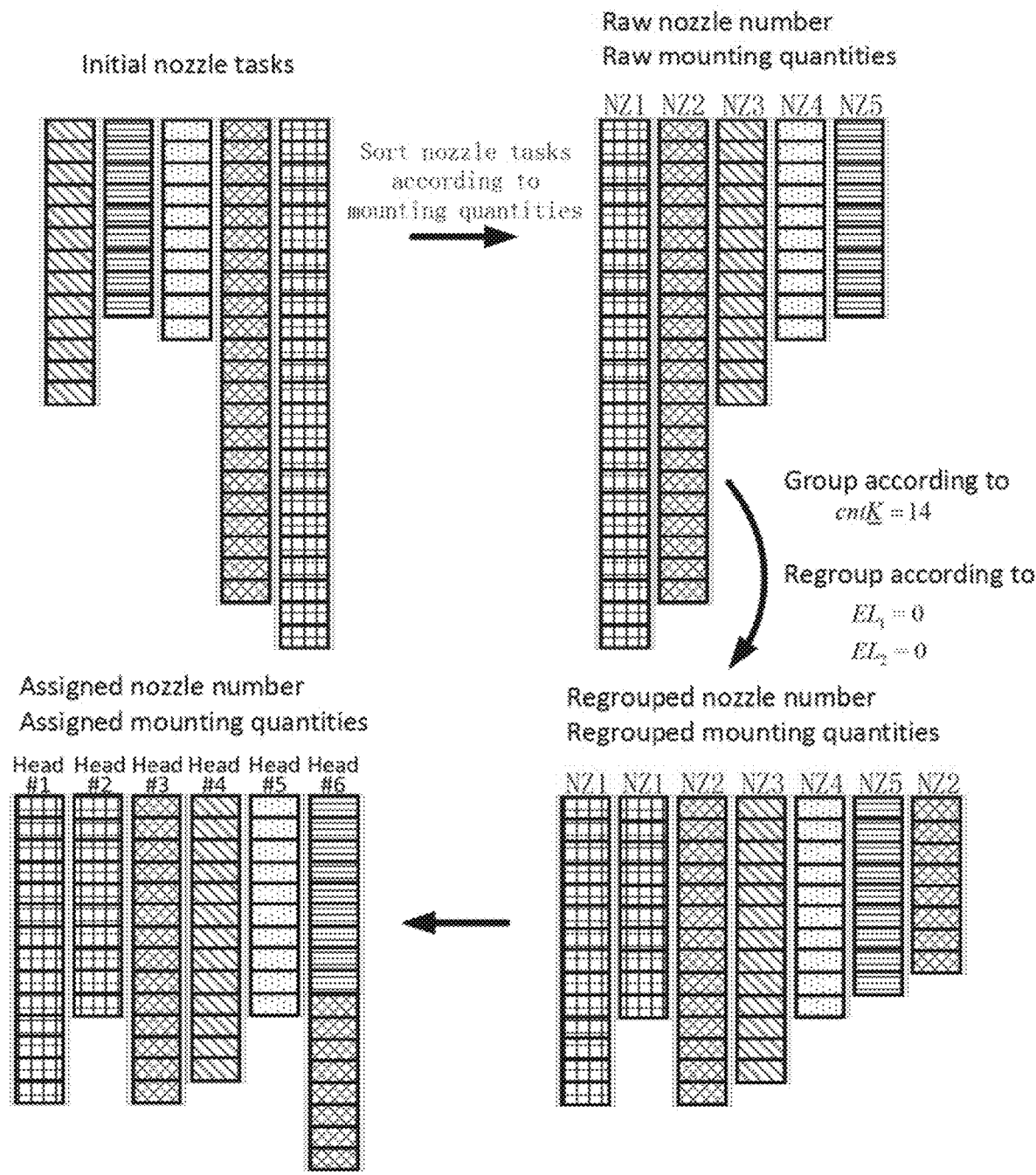
FIG. 11 is an optimization flow chart depicting the function of the last-column flag according to the preferred embodiment of the present invention.

Take nozzle n as an example, if its last-column flag $EL_n$, equals to 0, the last column of the nozzle n is stored following the main columns of the nozzle n (see FIG. 10). If the last-column flag $EL_n$ equals to 1, the last column of the nozzle n should be stored after all the main columns in the "regrouped nozzle number" and "regrouped mounting quantities". Last columns with last-column flags $EL_n$=1 should be stored in "regrouped nozzle number" and "regrouped mounting quantities" in descending order of the corresponding mounting quantities (as shown in FIG. 11).

Step (d) may further comprise a step (d.4) of defining two row vectors having S elements, which are called "assigned nozzle matrix" and "assigned mounting quantities". All the elements of these two row vectors are set to 0.

It is worth mentioning that S columns for each row vectors correspond to S available placement heads. Moreover, in the following steps, each of the "assigned nozzle matrix" and "assigned mounting quantities" will be extended as matrix with S columns and multiple rows.

Step (d) may further comprise a step (d.5) of setting the elements contained in the "assigned nozzle matrix" and "assigned mounting quantities".

Step (d.5) comprises the steps of:

(d.5.1) setting the elements of the first row of "assigned nozzles number", "assigned mounting quantities", wherein when the number of columns of the "regrouped nozzle number" and "regrouped mounting quantities" is not greater than S, sequentially storing each of these columns into the corresponding columns of the "assigned nozzles number" and the "assigned mounting quantities" respectively, and go to step (d.6) below, wherein when the number of columns of the "regrouped nozzle number" and "regrouped mounting quantities" is greater than S, sequentially storing the first S columns of the "regrouped nozzle number" and "regrouped mounting quantities" into the corresponding S columns of the "assigned nozzle matrix" and the "assigned mounting quantities" respectively, and go to step (d.5.2);

(d.5.2) setting the elements of all other rows of the "assigned nozzles number" and the "assigned mounting quantities", wherein the last row of each of the "assigned nozzles number" and the "assigned mounting quantities" is set as "current row". The setting of the elements starts from the S+1 column of the "regrouped nozzle number" and the "regrouped mounting quantities". Sequentially assign the following columns until no column left.

More specifically, step (d.5.2) comprises the steps of:

for each of the row of the "assigned nozzles number" and the "assigned mounting quantities", identifying the column having the least mounting quantities as the "allocated column" (other columns called non-allocated columns), and recording the corresponding least mounting quantities as $P_k$, where k represents the row number of the current row, wherein when there exist a plurality columns of the same least mounting quantities in the "assigned mounting quantities", then the "allocated column" is the one with the smallest column number.

The columns to be allocated in the "regrouped nozzle number" and the "regrouped mounting quantities" may be called "allocating column". If the "allocated column" in the kth row of the "assigned nozzle matrix" and the "allocating column" of the "regrouped nozzle number" have the same nozzle number, then the mounting quantities of the "allocated column" is to be updated as the current mounting quantities plus the mounting quantities of the "allocating column" of the "regrouped mounting quantities".

If the "allocated column" in the kth row of the "assigned nozzle matrix" and the "allocating column" of the "regrouped nozzle number" are of different nozzle numbers, then a new k+1th row is to be created in "assigned nozzle matrix" and the "assigned mounting quantities", wherein nozzle number of the non-allocated columns of the k+1th row of the "assigned nozzle matrix" is set to be the same as that of the kth row. The element of the "allocated column" will be set as the same nozzle number as the "allocating column" of the "regrouped nozzle number".

The mounting quantities of each of the non-allocated columns of the "assigned mounting quantities" is obtained by subtracting $P_k$ from the mounting quantities of the kth row. The mounting quantities of the allocated columns of the "assigned mounting quantities" may be set as mounting quantities of the "allocating columns" of the "regrouped mounting quantities". At this time, nozzle replacement will take place and count variable of nozzle replacements may be updated as V=V+1. If $P_k$ equals to 0, several nozzle replacement will take place between kth and k+1th row, and the head assembly needs only to travel to and from the auto nozzle changer 4 once, so that the count variable of trips between auto nozzle changer 4 W remains unchanged. If $P_k$>0, count variable of trips between auto nozzle changer 4 should be updated as W=W+1.

Step (d.5.2) should be repetitively executed until all columns of the "regrouped nozzle number" and the "regrouped mounting quantities" have been successfully allocated.

Step (d) may further comprise a step (d.6) of optimizing last row of the "assigned nozzle matrix" and the "assigned mounting quantities". In the last row of the "assigned nozzle matrix" and the "assigned mounting quantities", the mounting quantities of the columns having the same nozzle number may be averaged so as to minimize the maximal mounting quantities of the last row of each column for minimizing the pick-and-place cycles.

Step (d) may further comprise a step (d.7) of re-allocating tasks for the placement heads without nozzle tasks in the last row, corresponding to the columns, whose element is zero, in the last row of the "assigned mounting quantities". If the mounting quantities of a particular column in the last row is 0, that column will be regarded as allocated column. The last row having the greatest mounting quantities is regarded as the allocating column. The other remaining columns are regarded as non-allocated columns.

A new row may be created in each of the "assigned nozzle matrix" and the "assigned mounting quantities", wherein the element belonging to each of the non-allocated columns for the newly created row is identical to the element of the adjacently upper row. Moreover, the nozzle numbers of each the allocated columns and the allocating column of the "assigned nozzle matrix" are identical. The elements of the allocated columns of the "assigned mounting quantities" may be set as 0.

Again, in the last row of the "assigned nozzle matrix" and the "assigned mounting quantities", the mounting quantities of the columns having the same nozzle number may be averaged so as to minimize the mounting quantities of the last row of each column for minimizing the corresponding pick-and-place cycles.

If the reduction of the newly calculated pick-and-place cycles is greater than $e_1$, the newly created row may be retained, and the count variable of nozzle replacements and trips between auto nozzle changer should be updated as V=V+1 and W=W+1. If the reduction of the newly calculated pick-and-place cycles is less than $e_1$, the newly created row should be deleted. $e_1$ refers to a ratio between a nozzle replacement time to average time for carrying out a pick-and-place cycle. In this preferred embodiment, $e_1$=2. The objective of minimization of the number of pick-and-place cycles and the objective of minimization of the number of nozzle replacements contradict each other. The properly selection of $e_1$ helps to strike a balance between these two objectives.

Step (d) may further comprise a step (d.8) of the final processing of the "assigned nozzle matrix" and "assigned mounting quantities".

In relation to step (d.8), for all the columns of the last row of the "assigned mounting quantities", if the mounting quantities of each two non-zero columns are not identical, the non-zero minimum mounting quantities $P_k$ is to be recorded.

After that, a new row is created after the last row. In this newly created row, the mounting quantities remains 0 if the last row has the same mounting quantities, which is also 0. For other columns of this newly created row, the mounting quantities is the mounting quantities of the last row (i.e. adjacently upper row) minus $P_k$. If the last row of the "assigned mounting quantities" has 0 element in any of its columns, the corresponding columns of "assigned nozzle matrix" have the same corresponding elements as 0. This means the corresponding heads do not have any nozzle task at the moment.

Step (d) may further comprise a step (d.9) of finishing nozzle tasks assignment to get an "assigned nozzle matrix" having K rows and S columns. In step (d.9), the "nozzles workload" is created wherein the "nozzles workload" is a row vector having K columns. Each column of the "nozzles workload" stores the minimal non-zero element of each row of the "assigned mounting quantities" respectively, representing the corresponding number of pick-and-place cycles of each row of the "assigned nozzle matrix".

Remarks: a row of "assigned nozzle matrix" corresponds to multiple pick-and-place cycles. To simplify the expression, the concept of "sub-tour" may be defined. One sub-tour represents the several adjacent pick-and-place cycles of the same placement head task.

Step (e) comprises the steps of nozzle assignment exchange, that is switching the order of the columns in the "assigned nozzle matrix", wherein S columns will have $2^{S-1}$ ways of columns exchange, and all exchange ways will be stored. In this step, iNz is the index variable of the switching manner, which is initialized as iNz=1, iNz∈[1,$2^{S-1}$].

Remarks: when the columns in the "assigned nozzle matrix" are switched in pairs, objectives of the nozzle assignment will not be affected, including the number of pick-and-place cycles, the number of nozzle replacements, and the number of trips between auto nozzle changer. However, the switching step may increase the number of multiple-interval simultaneous pickup.

Remarks: the "nozzles workload" is unaffected by the nozzle assignment exchange.

In step (f), the method of the present invention verifies the loop condition of the "component allocation", that is, verifying whether all the nozzle assignment exchange ways have been investigated, if yes, go to step (g), if not, go back to step (c).

Step (f) comprises the steps of:
(f.1) comparing whether iNz is greater than $2^{S-1}$, if yes, looping through all the nozzle assignment exchange ways is completed, and go to step (g.8), if not, go to step (f.2); and
(f.2) according to iNz ways of nozzle assignment exchange, switching in pairs each of the columns of "assigned nozzle matrix" to form "switched nozzle matrix".

In step (f.2), the "switched nozzle matrix" includes K sub-tours. Define sub-tour index variable k∈{1, 2, . . . , K}, initialize and reset "completion flag" to zero for each of the sub-tours. As an example, the "completion flag" of sub-tour k $Done_k$=0. Moreover, define and initialize "completion count variable" as k1=0, which is used for counting the sub-tours having finished component allocation, that is, the subtours with $Done_k$=1, k∈{1, 2, . . . , K}.

Remarks: $Done_k$=0 means sub-tour k has not completed component allocation, whereas $Done_k$=1 means sub-tour k has completed component allocation.

Initialize an all-zero two-dimensional array of K rows and S columns to form "switched component matrix" for storing the component number to be picked and placed by each placement head in each sub-tour, wherein each of the component numbers in the "switched component matrix" corresponds to the nozzle numbers stored in the "switched nozzle matrix".

Initialize the optimal cost function value of "placement heads tasks assignment" bestE as infinitely large inf.

Remarks: in step (g.7) below, bestE is utilized to determine whether or not the "assigned nozzle matrix" will be further optimized, after switching the columns according to the exchange way indexed by iNz.

Step (f) further comprises the step (f.3) of determining whether completion count variable k1 is greater than K (that is, whether or not all sub-tour tasks allocation has been performed), if yes, tasks allocations for all sub-tours have been performed and go to step (g.7) below, if not, initialize sub-tour k=1, and initialize "inter-row most simultaneous pickups quantities" variable maxSP=−1, and initialize "optimal sub-tour" variable bestk=1, and go to step (f.4) below.

Remarks: in step (g.6), maxSP represents the most simultaneous pickups among all different sub-tours, namely distinguishing the row with the best component allocation results. Therefore, maxSP is named as "inter-row most simultaneous pickups quantities" and is utilized to update "inter-row best component row" and "inter-row best feeder group".

Step (f) further comprises the step (f.4) of determining whether sub-tour k>K (that is, all sub-tours have been examined), if yes, replacing the row indexed by bestk of "switched component matrix" by the "inter-row best component row", and incorporating "inter-row best feeder group" into "fixed feeder group", wherein the completion flag corresponding to bestk is set as $Done_{bestk}=1$, and k1=k1+1, and go back to step (f.3), if not, go to step (f.5) below.

Step (f) further comprises the step (f.5) of determining whether sub-tour k has carried out component allocation (i.e. whether or not $Done_k=1$), if yes, update loop variable k=k+1 and go back to step (f.4), if not, go to step (d.6) below.

Step (f) further comprises the step (f.6) of initializing a row vector of S columns storing the kth row of "switched nozzle matrix". This row is named as the "nozzle row". Another row vector of S columns having all elements as 0 is initialized and is referred to as "component row". This row is used to store each component number corresponding to each assigned nozzle matrix in the "nozzle row".

Remarks: this preferred embodiment supposes that there is one nozzle type n in the nozzle row. Step (g) illustrates component allocation for nozzle n.

Step (f) further comprises the step (f.7) of non-repeatedly retrieving the nozzle number from the nozzle row and storing them into a set $\hat{N}$, in such a manner that different nozzle number is stored once, and initializing and resetting "simultaneous-pickup-type flag" $flagS_n=0$ for nozzle n. If nozzle n corresponds to components of Mn simultaneous pickup types, the maximum value of $flagS_n$ is to be set as Mn, and $flagS_n \in [0, Mn]$.

Remarks: for different combinations of $flagS_n$, the results of component allocation for sub-tour k will be different, resulting in different number of simultaneous pickups.

Furthermore, the method of the present invention may also define "in-row most simultaneous pickups quantities" $maxSP_k$, the initial condition being $maxSP_k=-1$.

Remarks: $maxSP_k$ will be utilized to compare and update "in-row best component row" and "in-row best feeder group" in step (g.5). It is named as "in-row most simultaneous pickups quantities", since it is used for comparing different component allocation results of the same component row (i.e. sub-tour k), which is different from the "inter-row most simultaneous pickups quantities".

Step (f) further comprises the step (f.8) of determining whether the "simultaneous-pickup-type flags" $flagS_n$ corresponding to the nozzle numbers of the nozzle row are all at their maximum, i.e. $flagS_n=Mn$, where $n \in \hat{N}$, if yes, go to step (g.6) below, if not, go to step (g.1) below. Thus, step (f.8) is a loop condition according to the loop variable $flagS_n$.

Remarks: $flagS_n$ will be utilized in step (g) below. It will be used to get different component allocation results. For different combinations of "simultaneous-pickup-type flags" $flagS_n$ of each nozzle type, different component rows will be obtained.

Step (g) comprises the step (g.1) of allocating a component number for each column of the component row. Note that only one component number is allocated to each column of the component row. The allocation is performed according to the "simultaneous-pickup-type flags" $flagS_n$. The procedures are as follows:

If $flagS_n$ equals to 0, then all the component numbers corresponding to nozzle n are involved in the allocation, and the allocation is performed in descending order of the component numbers.

If $flagS_n$ equals to $\hat{m}$, and $\hat{m} \neq 0$, then the component number within the simultaneous pickup type $SPTh\_\hat{m}$ is allocated, wherein the allocation is performed in descending order of mounting quantities of the these component numbers.

Remarks: the above procedure ensure that the component number with more mounting quantities is of higher allocation priority.

The kth column of the "nozzles workload" stores the number of pick-and-place cycles $P_k$ of the kth nozzle row. Suppose the component number being allocated is $\hat{c}$, and the remaining mounting quantities of the component $\hat{c}$ is $P_{\hat{c}}$, and a new row vector having S columns may be newly created and referred to as "component row mounting quantities". The elements of the newly created row vector are all initially set as $P_k$. If $P_k > P_{\hat{c}}$, the allocated column of "component row mounting quantities" is replace by mounting quantities $P\hat{c}$, and the remaining mounting quantities of the component $\hat{c}$ should be updated to 0. If not, the remaining mounting quantities of the component $\hat{c}$ should be updated to $P_{\hat{c}} - P_k$.

Step (g) comprises the step (g.2) of splitting the nozzle row, which involves the following procedures:

Represent the minimum value of "component row mounting quantities" by $P_{c1}$. If $P_{c1} \geq P_k$, the workload of the nozzle row can be filled by the current component allocation, and if $P_{c1} < P_k$, the workload of the nozzle row cannot be completely filled by the current component allocation, meaning that another sub-tour needs to be added.

Furthermore, the newly added sub-tour is added in the following manner. Adding one row after the last row of each of the "switched nozzle matrix" and the "switched component matrix", wherein the values of the element of kth to Kth row are assigned to k+1th to K+1th row respectively. Moreover, a column is added to "nozzles workload" after the last column thereof so that the values of the element of k+1th to Kth columns are assigned to k+2th to K+1th columns respectively. The kth column stores $P_{c1}$ while the k+1th column stores $P_k - P_{c1}$. The total number of sub-tour is updated to K=K+1.

Step (g) comprises the step (g.3) of setting up an "ideal simultaneous pickup group", and defining the index variable of the "ideal simultaneous pickup group" as $i \in [1, I]$, the initial condition being i=1, wherein the "ideal simultaneous pickup group" utilizes 0 to represent those heads without pick-and-place tasks.

Step (g.3) comprises a step (g.3.1) of creating a new row vector having S columns as temporary variable, which stores component row (corresponding to sub-tour k) and is referred as "temporary component row". Step (g.3.1) also defines "in-row simultaneous pickups quantities" $SP_k$ for counting the quantities of in-row simultaneous pickups of sub-tour k, the initial condition being $SP_k=0$.

Step (g.3) comprises a step (g.3.2) of determining whether "temporary component row" is empty, if yes, go to step (g.3.3), if not, go to step (g.4) below.

Step (g.3) comprises a step (g.3.3) of determining whether the first column of "temporary component row" is 0 (0 means no assigned task for the corresponding head), if yes, deleting the first column of the "temporary component row" and go back to step (g.3.2), if not, creating a new row vector having S columns which is referred to as the "ideal simultaneous pickup group", and imparting "temporary component row" to "ideal simultaneous pickup group", and go to step (g.3.4).

Step (g.3) comprises a step (g.3.4) of determining whether each column of the "ideal simultaneous pickup group" can combine with its first column thereof to realize "ideal simultaneous pickup", if not, the corresponding column of the "ideal simultaneous pickup group" is reset to zero, if yes, the corresponding column of the "temporary component row" is set to zero, and go back to step (g.3.3).

Remarks: "ideal simultaneous pickup" needs the following conditions to be fulfilled:

(1) the number of feeder slots 222 occupied by each feeder 223 must be the same;

(2) the X-direction pickup offset and the Y-direction pickup offset of each feeder 223 must be the same;

(3) The head interval occupied by the corresponding feeder 223 is not greater than the interval of the heads where the components are allocated to (it is worth mentioning that the placement heads corresponds to the columns of the component row).

Remarks: the "ideal simultaneous pickup group" does not consider available number of placement heads. This number will be considered in step (g.4) below to obtain the "simultaneous pickup group", which represents the simultaneous pickup quantities that can be actually realized.

Remarks: in the above-mentioned conditions for "ideal simultaneous pickup", the number of heads occupied by a feeder 223 may be obtained by dividing the width of the feeder 223 by head interval and rounding up the quotient.

Remarks: in subsequent steps, suppose I "ideal simultaneous pickup group" is obtained by step (g.3), define "ideal simultaneous pickup group" index variable $i \in [1,I]$, the initial condition being $i=1$.

Remarks: if an element of the "ideal simultaneous pickup group" is 0, the corresponding head has no pick-and-place task.

Step (g) comprises the step (g.4) of updating "in-row best feeder group" which comprises the steps of:

(g.4.1) determining whether the loop conditions of "ideal simultaneous pickup group" is fulfilled, that is, if $i>I$, go to step (g.5) below, if not, go to step (g.4.2) below;

(g.4.2) determining whether all the elements of ith "ideal simultaneous pickup group" are zero, if yes, $i=i+1$, and go to step (g.4.4) if not, go to step (g.4.3);

(g.4.3) allocating ith "ideal simultaneous pickup group" to form the "component row feeder group". The procedures are as follows:

creating a new row vector which is referred to as "candidate feeder group", and imparting the values of the elements of the "ideal simultaneous pickup group" to the "candidate feeder group", and assessing each column of the "candidate feeder group". If for a certain column, the number of available feeders for the corresponding component number is 0, the elements of that corresponding column in the "candidate feeder group" is set to 0. Moreover, the procedures also comprise the step of recording the number of non-zero column of the "candidate feeder group" as the maximally realizable quantities of simultaneous pickups $SP_i$.

exploiting the "fixed feeder groups" and the available feeders left, maximally realize the "ideal simultaneous pickup group". Accordingly, the maximally realizable quantities of simultaneous pickups are recorded as $SP_{i1}$.

If $SP_i > SP_{i1}$, $SP_k = SP_k + SP_i$. The "candidate feeder group" is to be regarded as the "component row feeder group". If $SP_i \leq SP_{i1}$, $SP_k = SP_k + SP_{i1}$. The "fixed feeder group" achieves better results and is regarded as the "component row feeder group".

$SP_k$ refers to "in-row simultaneous pickups quantities".

The columns of the "ideal simultaneous pickup group" which have been realized by the "component row feeder group" are set to zero, and go back to step (g.4.2).

Step (g.4) further comprises a step (g.4.4) of updating the "in-row most simultaneous pickups quantities", "in-row best component row" and "in-row best feeder group".

The procedures are as follows: compare the "in-row simultaneous pickups quantities" $SP_k$ and the "in-row most simultaneous pickups quantities" $maxSP_k$. If $SP_k > maxSP_k$ then $maxSP_k = SP_k$ and the "in-row best component row" is replaced by the current component row, and the "in-row best feeder group" is replaced by "component row feeder group", and go back to step (g.4.1). If $SP_k \leq maxSP_k$, go back to step (g.4.1) directly.

Step (g) comprises the step (g.5) of updating "simultaneous-pickup-type flags" $flagS_n$ corresponding to each nozzle in the kth nozzle row, and going back to step (f.8).

Remarks: the "simultaneous-pickup-type flags" corresponding to the nozzles in the kth nozzle row may be updated using the carry bits (the manner in which the "simultaneous-pickup-type flags" are updated is similar to the manner described for the last-column flag in step (g.9) below).

Step (g) comprises the step (g.6) of updating the "inter-row most simultaneous pickups quantities", the "inter-row best component row" and "inter-row best feeder group". The procedures are as follows:

Supposing that the kth sub-tour corresponds to Ck pick-and-place cycles (Ck is the kth column of "nozzles workload"), and comparing $Ck \times maxSP_k$ with the "inter-row most simultaneous pickups quantities", in such a manner that if $Ck \times maxSP_k > maxSP$ then update $maxSP = Ck \times maxSP_k$, updating the "inter-row best component row" to become "in-row best component row", updating the "inter-row best feeder group", updating optimal sub-tour $bestk = k$ and updating sub-tour $k = k+1$, and going to step (f.4).

Updating the "inter-row best feeder group" means adding "in-row best feeder group" into the "inter-row best feeder group".

If $Ck \times maxSP_k \leq maxSP_k$ go back to step (f.4).

Step (g) comprises the step (g.7) of calculating the cost function of "placement heads tasks assignment" E, and if it is better than the current optimal cost function, i.e. E<bestE, then updating the current optimal placement heads tasks assignment cost function bestE=E, and updating the results of placement heads tasks assignment, including the steps of updating "optimal nozzle matrix" to be "switched nozzle matrix", updating "optimal component matrix" to be "switched component matrix", updating "best feeder group" to be the "fixed feeder group", and updating the index variable of the switching manner iNz+1, and go back to step (f.1).

The cost function of the "placement heads tasks assignment" may be calculated as:

$$E = \tilde{K} + e_1 \cdot \sum_{\tilde{k}=1}^{\tilde{K}} \sum_{j=1}^{S} v_{j\tilde{k}} + e_2 \cdot \sum_{\tilde{k}=1}^{\tilde{K}} w_{\tilde{k}} - e_3 \cdot \sum_{\tilde{k}=1}^{\tilde{K}} SP_{\tilde{k}}$$

where $\tilde{K}$ being the quantities of pick-and-place cycles, $\tilde{k} \in \{1, 2, \ldots, \tilde{K}\}$ being pick-and-place cycle index, S being the number of heads 2121 on the head assembly 211, j∈{1, 2, ..., S} being heads index, $$\sum_{\tilde{k}=1}^{\tilde{K}} \sum_{j=1}^{S} v_{j\tilde{k}}$$

being the number of nozzles replacements, $$\sum_{\tilde{k}=1}^{\tilde{K}} w_{\tilde{k}}$$

being the number of trips between auto nozzle changer 4, $$\sum_{\tilde{k}=1}^{\tilde{K}} SP_{\tilde{k}}$$

being the number of simultaneous pickups, $e_1$ being the weighting of nozzles replacement, $e_2$ being the weighting of the number of trips between auto nozzle changer 4, $e_3$ being the weighting of simultaneous pickups.

As there are many variables describing different types of cycles, it is worth mentioning that the minimum number of pick-and-place cycles $\underline{K}$ is an intermediate variable for obtaining nozzle-tasks limit cnt$\underline{K}$ in step (b.5). k is a count variable of the sub-tours of the "nozzle assignment". In step (d), k will be increased dynamically during nozzle assignment ending up with the total number of sub-tours K. Step (g.2) performs splitting of the nozzles row, causing changes to the number of sub-tours, after which in order to distinguish from k and K, $\tilde{k}$ and $\tilde{K}$ are utilized respectively.

All weightings may be obtained by calculating the ratio between the time spend performing a specific action and average time required for a pick-and-place cycle. Exemplary conditions may be set as $e_1=2$, $e_2=0.5$, $e_3=1/6$.

Remarks: the number of nozzle replacements and the number of trips between auto nozzle changer 4 correspond to V and W in step (d.2), that is $$V = \sum_{\tilde{k}=1}^{\tilde{K}} \sum_{j=1}^{S} v_{j\tilde{k}} \text{ and } W = \sum_{\tilde{k}=1}^{\tilde{K}} w_{\tilde{k}}.$$

Step (g) comprises the step (g.8) of determining whether the overall result obtained in step (g.7) is superior than "global optimal cost function value" of "placement heads tasks assignment", that is bestE>GbestE, if yes, updating GbestE=bestE, updating "global optimal nozzle matrix" to be "optimal nozzle matrix", updating "global optimal component matrix" to be "optimal component matrix", updating "global best feeder group" to be "best feeder group" and go to step (g.9), if not, go to step (g.9) directly.

Remarks: GbestE is the global optimal cost function value of "placement heads tasks assignment".

Step (g) comprises the step (g.9) of updating last-column flag $EL_M$, and go back to step (d.2).

The last-column flag $EL_n$ is updated according to the following procedures:

updating the last-column flag $EL_j=EL_j+1$ for nozzle 1, and updating the last-column flags of all nozzles in ascending order, that is, if $EL_{n-1}>1$, then $EL_{n-1}=0$ and $EL_n=EL_n+1$ (these last-column flags may determine the "regrouped nozzle number" and "regrouped mounting quantities" in step (d.3) above).

Remarks: $EL_{n-1}$ is the last-column flag of suction nozzle n−1.

Step (h) comprises the step of outputting the optimal placement heads tasks assignment after investigating all nozzle assignment possibilities. The optimal assignment results include: the "global optimal nozzle matrix", the "global optimal component matrix" and the "global best feeder group" are fully updated in step (g.8).

Step (g) as described above accomplishes component allocation. That is, step (g) investigates the switching ways described in step (f) to exchange nozzle assignment results, and to find the optimal component allocation result based on the exchanged nozzle assignment results, which include the component number for each placement head in each sub-tour, and the corresponding feeder group.

Moreover, this step also uses cost functions to evaluate the current allocation result. If the current cost function is even superior, the current component allocation results are updated as the optimal component allocation results, the current nozzle assignment results are updated as the optimal nozzle assignment results, and the current feeder group results are updated as the best feeder group results.

The advantageous effects of the present invention may be illustrated by the following exemplary applications and data:

The exemplary application may be a beam-type single-gantry surface mounter having six heads 2121 provided on the placement head assembly 211. The initial conditions may be a list of PCB data listed in Table 3 below:

TABLE 3

| Serial No. | Component type | X-coordinate | Y-coordinate |
|---|---|---|---|
| 1 | TR2__TO252 | 38.56 | 78.74 |
| 2 | TR2__TO252 | 47.6 | 114.7 |
| 3 | TR2__TO252 | 52.95 | 137.1 |
| 4 | TR2__TO252 | 63.73 | 86.69 |
| 5 | TR2__TO252 | 128.6 | 131.5 |
| 6 | SOT23 | 97.36 | 130.7 |
| 7 | SOT23 | 27.69 | 106.4 |
| 8 | SOT23 | 123.0 | 46.68 |
| 9 | SOT23 | 85.01 | 110.6 |
| 10 | SOT23 | 43.9 | 91.15 |
| 11 | SOT23 | 101.3 | 80.30 |
| 12 | SOT23 | 50.14 | 138.3 |
| 13 | SOT23 | 51.72 | 96.28 |
| 14 | SOT23 | 106.1 | 127.9 |
| 15 | 1117__3.3V | 29.12 | 118.5 |
| 16 | 1117__3.3V | 89.33 | 38.62 |
| 17 | 1117__3.3V | 36.88 | 81.77 |
| 18 | 1117__3.3V | 122.7 | 61.56 |
| 19 | 1117__3.3V | 104.3 | 95.21 |
| 20 | 1117__3.3V | 62.91 | 40.47 |
| 21 | 1117__3.3V | 91.35 | 114.5 |
| 22 | 1117__3.3V | 127.6 | 89.29 |
| 23 | QFP__ATME | 38.69 | 91.94 |
| 24 | QFP__ATME | 127.8 | 113.8 |
| 25 | QFP__ATME | 22.6 | 24.78 |
| 26 | QFP__ATME | 113.8 | 91.33 |
| 27 | QFP__ATME | 42.08 | 58.80 |
| 28 | QFP__ATME | 32.39 | 76.42 |
| 29 | QFP__ATME | 90.07 | 94.81 |
| 30 | QFP__ATME | 74.10 | 65.10 |
| 31 | QFP__ATME | 48.54 | 55.99 |
| 32 | QFP__ATME | 74.98 | 77.73 |
| 33 | SOJ-ds2505 | 129.0 | 32.50 |
| 34 | SOJ-ds2505 | 46.08 | 50.38 |

TABLE 3-continued

| Serial No. | Component type | X-coordinate | Y-coordinate |
|---|---|---|---|
| 35 | SOJ-ds2505 | 94.94 | 123.3 |
| 36 | SOJ-ds2505 | 39.97 | 37.92 |
| 37 | SOJ-ds2505 | 66.91 | 92.36 |
| 38 | SOJ-ds2505 | 64.15 | 60.01 |
| 39 | SOJ-ds2505 | 74.03 | 49.85 |
| 40 | SOJ-ds2505 | 64.26 | 52.33 |
| 41 | SOJ-ds2505 | 57.88 | 75.75 |
| 42 | SOJ-ds2505 | 70.98 | 35.77 |
| 43 | SOJ-ds2505 | 20.69 | 33.14 |
| 44 | SOJ-ds2505 | 31.65 | 29.09 |
| 45 | SOJ-ds2505 | 114.9 | 130.0 |
| 46 | 74SOP16 | 103.5 | 100.1 |
| 47 | 74SOP16 | 86.05 | 61.33 |
| 48 | 74SOP16 | 79.66 | 91.15 |
| 49 | 74SOP16 | 38.34 | 115.7 |
| 50 | 74SOP16 | 72.95 | 138.2 |
| 51 | 74SOP16 | 55.90 | 89.51 |
| 52 | 74SOP16 | 130.2 | 100.6 |
| 53 | 74SOP16 | 36.24 | 31.27 |
| 54 | 74SOP16 | 114.7 | 98.88 |
| 55 | PLCC-29SF | 91.02 | 68.36 |
| 56 | PLCC-29SF | 35.04 | 36.75 |
| 57 | PLCC-29SF | 113.6 | 136.2 |
| 58 | PLCC-29SF | 64.13 | 81.59 |
| 59 | PLCC-29SF | 58.25 | 79.94 |
| 60 | PLCC-29SF | 43.18 | 53.79 |
| 61 | PLCC-29SF | 105.1 | 54.22 |
| 62 | PLCC-29SF | 113.4 | 84.70 |
| 63 | PLCC-29SF | 119.7 | 82.48 |
| 64 | PLCC-29SF | 87.62 | 51.97 |
| 65 | PLCC-29SF | 22.90 | 102.5 |
| 66 | PLCC-29SF | 82.14 | 100.9 |
| 67 | PLCC-29SF | 98.80 | 44.22 |
| 68 | PLCC-29SF | 81.75 | 129.9 |
| 69 | PLCC-29SF | 60.44 | 101.9 |
| 70 | PLCC-29SF | 26.49 | 73.79 |
| 71 | PLCC-29SF | 57.32 | 123.6 |
| 72 | PLCC-29SF | 63.00 | 118.8 |
| 73 | PLCC-29SF | 108.3 | 47.00 |
| 74 | PLCC-29SF | 132.7 | 39.93 |
| 75 | PLCC-29SF | 48.09 | 67.23 |
| 76 | PLCC-29SF | 51.14 | 76.49 |
| 77 | PLCC-29SF | 38.52 | 72.59 |
| 78 | PLCC-29SF | 52.98 | 52.47 |

"Feeders data file" may be listed in Table 4 below:

TABLE 4

| Feeders type | X-direction pickup offset | Y-direction pickup offset | Occupied Feeder Slots |
|---|---|---|---|
| SM8 | 7.25 | −13.5 | 1 |
| SM12 | 15.3 | −42 | 2 |
| SM16 | 15.3 | −42 | 2 |
| SM24 | 20.05 | −62 | 3 |

The component data file may be listed in Table 5 below:

TABLE 5

| Component type | Nozzle Type | Feeder Type |
|---|---|---|
| TR2_TO252 | CN220 | SM16 |
| SOT23 | CN065 | SM8 |
| 1117_3.3V | CN220 | SM12 |
| QFP_ATME | CN400 | SM16 |
| SOJ2-ds2505 | CN065 | SM12 |
| 74SOP16 | CN140 | SM16 |
| PLCC-29SF | CN750 | SM24 |

Suppose that there is no unavailable feeder slot 222 and there exist sufficient nozzles (6 nozzles for each nozzle type thereof) and sufficient number of feeders 223 (6 feeders 223 for each type of components).

When "optimization" command is activated, the pick-and-place optimization process will start, the first being "production data pre-processing". First, the optimization allocates component number for each type of electronic components according to their sequence in PCB data. Moreover, each nozzle type may be allocated a nozzle number in the descending order of the mounting quantities of each nozzle type. With the help of "component data file", index relationship between components number and nozzle number may be illustrated in Table 6 below:

TABLE 6

| Component Type | Component Number | Pick-and place spots number | Nozzle Type | Nozzle Number |
|---|---|---|---|---|
| TR2_TO252 | CP1 | 5 | CN220 | NZ3 |
| SOT23 | CP2 | 9 | CN065 | NZ5 |
| 1117_3.3V | CP3 | 8 | CN220 | NZ3 |
| QFP_ATME | CP4 | 10 | CN400 | NZ4 |
| SOJ2-ds2505 | CP5 | 13 | CN065 | NZ2 |
| 74SOP16 | CP6 | 9 | CN140 | NZ2 |
| PLCC-29SF | CP7 | 24 | CN750 | NZ1 |

After that, with the help of "component data file" and "feeders data file", the simultaneous pickup types of electronic components corresponding to each nozzle number may be illustrated in Table 7 below (the example here refers to a situation where each type of nozzles correspond to one simultaneous type of electronic components).

TABLE 7

| Nozzle Number | Component Number |
|---|---|
| NZ1 | CP7 |
| NZ2 | CP5, CP6 |
| NZ3 | CP1, CP3 |
| NZ4 | CP4 |
| NZ5 | CP2 |

Based on the data above, calculate minimum number of pick-and-place cycles $\underline{K}=\lceil 78/6 \rceil=13$ and determine the variation range of "nozzle-tasks limit" cnt$\underline{K}$, whose minimum value is min$\underline{K}=\underline{K}-6=7$ and the maximum value is max $\underline{K}=\underline{K}+10=23$.

As a representative of the nozzle assignment process, the situation cnt$\underline{K}$=14, $EL_1$=0, $EL_2$=0 is investigated. FIG. 10 illustrates the assignment process, where each rectangular block represents mounting quantities of one. Different nozzle number may be represented by different textures in FIG. 10. First, each nozzle type may be sorted according to the mounting quantities and each nozzle may be accorded a nozzle number to form "raw nozzle number" and "raw mounting quantities". The nozzles 2122 may then be grouped according to "nozzle-tasks limit" cnt$\underline{K}$=14 to form "group nozzle number" and "group mounting quantities".

According to the last-column flags of $EL_1$=0 and $EL_2$=0, the method may regroup the "group nozzle number" and the "group mounting quantities" and form seven groups of the "regrouped nozzle number" and the "regrouped mounting quantities". These groups are sequentially allocated to the heads 2121, which forms the first nozzle row. The seventh group is allocated to the head 2121 having the least mounting quantities. At this time, the nozzle replacement number becomes V=1, and the number of trips between auto nozzle changer 4 becomes W=1, resulting in "assigned nozzle matrix" and "assigned mounting quantities". The mounting quantities of the heads with the same nozzle number in the last row should then be averaged. As shown in FIG. 10, head

1 and head #2 are fixed with nozzle 1 (NZ1) and the mounting quantities of head #1 and head #2 has been averaged. Finally, the method of the present invention will allocate the nozzle type with the most mounting quantities to those heads 2121 without nozzle tasks (i.e. mounting quantities=0). For example, FIG. 10 illustrates that head #4 has the most mounting quantities, the nozzle on head #4, namely NZ5, is then installed on head #6. Accordingly, the nozzle replacement number adds one and becomes V=2, the number of trips between auto nozzle changer 4 becomes W=2. Although the number of nozzles replacement has increased, the number of pick-and-place cycles has decreased from 17 to 14.

In order to illustrate the function of the last-column flag, the last-column flags are also tested as $EL_1=0$ and $EL_2=1$. This is shown in FIG. 11 of the drawings. Because $EL_2=1$, when the "regrouped nozzle number" and the "regrouped mounting quantities" are obtained, the last column of NZ2 will be placed behind all other main columns, and this can increase the diversity of "regrouped nozzle number" and "regrouped mounting quantities", thereby making it possible to find even better nozzles assignment results.

After allocation of nozzles 2122, allocation of electronic components may start. Table 8 to Table 11 below illustrates the situation where nozzle tasks have not been switched for heads 2121.

TABLE 8

|  | Head1 | Head2 | Head3 | Head4 | Head5 | Head6 | PAP cycles |
|---|---|---|---|---|---|---|---|
| Sub-tour 1 | NZ1 | NZ1 | NZ2 | NZ2 | NZ3 | NZ4 | 8 |
| Sub-tour 2 | NZ1 | NZ1 | NZ2 | NZ5 | NZ3 | NZ4 | 2 |
| Sub-tour 3 | NZ1 | NZ1 | NZ2 | NZ5 | NZ3 | NZ5 | 2 |
| Sub-tour 4 | 0 | 0 | NZ2 | NZ5 | NZ3 | NZ5 | 1 |
| Sub-tour 5 | 0 | 0 | NZ2 | NZ5 | 0 | 0 | 1 |

TABLE 9

|  | Head1 | Head2 | Head3 | Head4 | Head5 | Head6 | PAP cycles |
|---|---|---|---|---|---|---|---|
| Sub-tour 1 | CP7 | CP7 | CP5 | CP6 | CP3 | CP4 | 8 |
| Sub-tour 2 | CP7 | CP7 | CP5 | CP2 | CP1 | CP4 | 2 |
| Sub-tour 3 | CP7 | CP7 | CP5 | CP2 | CP1 | CP2 | 2 |
| Sub-tour 4 | 0 | 0 | CP5 | CP2 | CP1 | CP2 | 1 |
| Sub-tour 5 | 0 | 0 | CP6 | CP2 | 0 | 0 | 1 |

TABLE 10

| Feeder group 1 | CP5 | CP6 | CP3 | CP4 |
| Feeder group 2 | CP5 |  | CP1 | CP4 |
| Feeder group 3 | CP2 |  | CP2 |  |
| Feeder group 4 | CP7 |  |  |  |

TABLE 11

| Simultaneous pick-and-place type | 1S | 2S | 3S | 4S | 5S | 6S |
|---|---|---|---|---|---|---|
| Number | 28 | 6 | 2 | 8 | 0 | 0 |

The simultaneous mounting quantities may be calculated by:

$$\sum_{k=1}^{k} SP_k = 6\times(2-1) + 2\times(3-1) + 8\times(4-1) = 34$$

The corresponding cost function value is:

$$E = 14 + e_1 \cdot 2 + e_2 \cdot 2 - e_3 \cdot 34 \approx 13.3$$

After the nozzle assignment exchange, the optimal component allocations results are presented in Table 12 To Table 15 below:

TABLE 12

|  | Head1 | Head2 | Head3 | Head4 | Head5 | Head6 | PAP cycles |
|---|---|---|---|---|---|---|---|
| Sub-tour 1 | NZ1 | NZ2 | NZ1 | NZ3 | NZ4 | NZ2 | 8 |
| Sub-tour 2 | NZ1 | NZ2 | NZ1 | NZ3 | NZ4 | NZ5 | 2 |
| Sub-tour 3 | NZ1 | NZ2 | NZ1 | NZ3 | NZ5 | NZ5 | 2 |
| Sub-tour 4 | 0 | NZ2 | 0 | NZ3 | NZ5 | NZ5 | 1 |
| Sub-tour 5 | 0 | NZ2 | 0 | 0 | 0 | NZ5 | 1 |

TABLE 13

|  | Head1 | Head2 | Head3 | Head4 | Head5 | Head6 | PAP cycles |
|---|---|---|---|---|---|---|---|
| Sub-tour 1 | CP7 | CP5 | CP7 | CP3 | CP4 | CP6 | 8 |
| Sub-tour 2 | CP7 | CP5 | CP7 | CP1 | CP4 | CP2 | 2 |
| Sub-tour 3 | CP7 | CP5 | CP7 | CP1 | CP2 | CP2 | 2 |
| Sub-tour 4 | 0 | CP5 | 0 | CP1 | CP2 | CP2 | 1 |
| Sub-tour 5 | 0 | CP6 | 0 | 0 | 0 | CP2 | 1 |

TABLE 14

| Feeder group 1 | CP7 |  | CP7 | CP4 |  |
| Feeder group 2 | CP5 |  | CP3 | CP4 | CP6 |
| Feeder group 3 | CP5 |  | CP1 |  |  |
| Feeder group 4 | CP2 | CP2 |  |  |  |

TABLE 15

| Simultaneous pick-and-place type | 1S | 2S | 3S | 4S | 5S | 6S |
|---|---|---|---|---|---|---|
| Number | 4 | 18 | 2 | 8 | 0 | 0 |

The simultaneous mounting quantities may be calculated by:

$$\sum_{\overline{k}=1}^{\overline{K}} SP_{\overline{k}} = 18 \times (2-1) + 2 \times (3-1) + 8 \times (4-1) = 46$$

The corresponding cost function value is: $E=14+e_1 \cdot 2 + e_2 \cdot 2 - e_3 \cdot 46 \approx 11.3$ Thus, the number of simultaneous pick-and-place after switching of nozzle assignment has increased by 12. This is because CP7 may perform the multi-interval simultaneous pickup. In the superior component allocation result, CP7 accomplishes a one-interval two simultaneous pickup during 6 pick-and-place cycles.

The present invention, while illustrated and described in terms of a preferred embodiment and several alternatives, is not limited to the particular description contained in this specification. Additional alternative or equivalent components could also be used to practice the present invention.

What is claimed is:

1. An optimization approach for placement heads tasks assignment of beam-type single-gantry surface mounters comprises the steps of:
    (a) importing user-defined production parameters and forming raw production data for said beam-type single-gantry surface mounters;
    (b) pre-processing said raw production data and obtaining the intermediate production data that facilitates the subsequent processing;
    (c) verifying the loop condition of the "placement heads tasks assignment", that is, looping through all the nozzle assignment possibilities by setting nozzle-tasks limit as the loop variable, and verifying whether said nozzle-tasks limit reaches its maximum, if yes, some nozzle assignment possibilities has yet to be examined and searching continue according to step (d) to step (g) below, if not, optimal nozzle assignment has been reached and searching may stop and carry out step (h);
    (d) performing nozzle assignment according to "raw nozzle number", "raw nozzle placement quantity", and "nozzle-tasks limit" in intermediate production data to obtain a nozzle assignment result, namely the optimal nozzle type selection for each head per pick-and-place cycle;
    (e) confirming all the nozzle assignment exchange possibilities;
    (f) verifying whether the loop condition of "component allocation" are fulfilled, if yes, carry out step (g), if not, carry out step (c);
    (g) performing component allocation, wherein exchanging said nozzle assignment results between said placement heads according to said possibilities confirmed in (e), and allocating component type corresponding to said exchanged nozzle assignment, to obtain a component assignment result, namely said optimal component type allocation for each head per pick-and-place cycle, together with said assigned feeder groupings, whereafter evaluating said component allocation results by the cost function, and when said current cost function is superior to said previous best cost function, performing the following replace operations, namely replacing said previous best component allocation results by said current component allocation results, replacing said previous best nozzle assignment results by said current nozzle allocation results, and replacing said previous best cost function by said current cost function; ending up with returning to (f); and
    (h) outputting said optimal placement heads tasks assignment results.

2. The method, as recited in claim 1, wherein said step (a) comprises the steps of:
    (a.1) executing said pick-and-place optimization software and initializing production data of said surface mounter;
    (a.2) importing PCB data to said pick-and-place optimization software; and
    (a.3) setting user-defined data in said pick-and-place optimization software;
    (a.4) clicking the run button displayed in said pick-and-place optimization software, which starts said optimization algorithm proposed in the present invention,
    said step (a.1) comprises said steps of:
    (a.1.1) initializing said surface mounter's production parameters, including said total number of placement heads, said total number of feeder slots, intervals between two adjacent heads, intervals between each two adjacent feeder slots etc.; and
    (a.1.2) automatically reading said data files for feeders and said data files for electronic components, said data files for feeders may include information regarding components feeder type, X-direction pickup offset, Y-direction pickup offset, and said number of feeder slots occupied by each feeder, said data files for electronic components may include information regarding said type of electronic components, said corresponding types of feeders, and said corresponding types of nozzles,
    wherein in said step (a.2), said PCB production data may include component serial number, component type and mounting coordinates,
    said step (a.3) comprises said steps of:
    (a.3.1) setting inactive heads in said pick-and-place process;
    (a.3.2) setting inactive feeder slots in said pick-and-place process; and
    (a.3.3) setting the available number of said feeders for each type of said electronic components and the available number of said nozzles for each type of said nozzles.

3. The method, as recited in claim 2, wherein said step (b) comprises the steps of:
    (b.1) processing the PCB data in PCB data file to obtain index relationship between components, feeders and nozzles;
    (b.2) defining two row vectors of N elements, wherein one of the row vectors stores nozzle number as "raw nozzle number", while another one of the row vectors stores mounting quantities for each corresponding "raw nozzle number" and is named as "raw mounting quantities";
    (b.3) counting simultaneous pickup types of corresponding electronic components for each nozzle number, for use in component allocation;
    (b.4) calculating the minimum number of pick-and-place cycles $\underline{K}$; and
    (b.5) determining the variation range of "nozzle-tasks limit" cnt$\underline{K}$,
    wherein said step (b.1) comprises the step of counting the number of types of electronic components in the PCB data file (components having the same name should be regarded as the same type) to obtain a total number of components type C, and assigning each type of electronic components a component number c∈ {(1, 2, . . . , C} based on the corresponding sequence in PCB data file. Said mounting quantities of each electronic component type is also called the mounting quantities of the corresponding component number, "Component c" refers to a particular type of electronic components to be placed, said mounting quantities of said specific component number refer to the total number of said mounting spots on the PCB for that particular type of electronic components, said PCB data file includes information of electronic components serial number, the type of electronic components, mounting spots' coordinates, based on information contained in said PCB data file and said component data file, information regarding the used nozzle types and index relationship between component c and nozzle β(c) can be obtained, based on a descending order of the mounting quantities of each nozzle type, each nozzle type is assigned with a nozzle number as n∈{1, 2, . . . , N}, where N is the total number of nozzle types, namely β(c)∈{1, 2, . . . , N}, wherein note that said mounting quantities of each nozzle type is also said mounting quantities of each nozzle number, wherein one type of nozzle may be used for picking up different types of electronic components, the mounting quantities of a specific nozzle type refer to the sum of mounting quantities of the electronic components that can be picked up by this nozzle type, the component data file may contain information regarding the types of electronic components, the type of feeders for each type of components, and the types of nozzles for each type of components, based on the information in the PCB data file and component data file, one may obtain information regarding the used feeder types, and index relationship between component c and the corresponding feeder γ(c), wherein we may designate f∈{1, 2, . . . , F} as index number of feeders, where F is the total number of feeder types, and we have γ(c)∈{1, 2, . . . , F}, two row vectors having N columns are defined, in which one of the row vectors stores "nozzle number", and called "raw nozzle number", wherein another row vector stores said mounting quantities of corresponding "raw nozzle number" and is called "raw mounting quantities", raw nozzle number is arranged and stored in ascending order, wherein as said nozzle numbers is assigned according to the mounting quantities of the corresponding nozzle type in descending order, so that said "raw mounting quantities" is also sorted in descending order, in step (b.3), said electronic components corresponding to said nozzle numbers can be categorized, according to the types of simultaneous pickup, wherein take nozzle n for example, when nozzle n corresponds to Mn simultaneous pickup type, wherein the simultaneous pickup types are numbered in descending order of the mounting quantities of different simultaneous pickup types, which may be designated by $SPTn\_m \in \{SPTn\_1, SPTn\_2, \ldots, SPTn\_Mn\}$, it can be known from the component data file that a particular type of nozzle may be used for picking and placing many electronic components, which, as can be known from the feeder data file, will be supplied by different types of feeders, and therefore, a particular nozzle type may be used to pick and place many different types of components that can be classified into different simultaneous pickup type, Step (b.4) comprises the step of dividing the total mounting quantities of all the components on the PCB by number of the available heads, and rounding up the result to obtain the minimum number of pick-and-place cycles $\underline{K}$, wherein in step (b.5), the minimum number of pick-and-place cycles $\underline{K}$ may minus an integer a1 to obtain the minimum value $\min\underline{K}$ of $cnt\underline{K}$, and similarly, $\underline{K}$ may add an integer a2 to obtain a maximum value $\max\underline{K}$ of $cnt\underline{K}$, and thus, $\min\underline{K}=\underline{K}-a1$ and $\max\underline{K}=\underline{K}+a2$.

4. The method, as recited in claim 3, wherein in said step (c), said loop conditions of said placement head task assignment may be carried out by determining whether or not cnt $\underline{K}$ is less than $\max\underline{K}$, wherein if yes, carry out step (d) to step (g), wherein if not, go to step (h).

5. The method, as recited in claim 4, wherein said step (d) comprises the steps of:
(d.1) defining two row vectors for each nozzle number, respectively containing the "group nozzle number" and "group mounting quantities";
(d.2) setting loop conditions for nozzles assignment;
(d.3) defining two row vectors for each nozzle number, the two row vectors being "regrouped nozzle number" and "regrouped mounting quantities" respectively, wherein said regrouped nozzle number" and said "regrouped mounting quantities" are obtained from "group nozzle number" and "group mounting quantities" according to said last-column flag $EL_n$;
(d.4) defining two row vectors having S elements, which are called "assigned nozzle matrix" and "assigned mounting quantities", wherein all the elements of these two row vectors are set to 0;
(d.5) setting the elements contained in the "assigned nozzle matrix" and "assigned mounting quantities";
(d.6) optimizing last row of said "assigned nozzle matrix" and said "assigned mounting quantities". In the last row of said "assigned nozzle matrix" and said "assigned mounting quantities", said mounting quantities of said columns having said same nozzle number may be averaged so as to minimize said maximal mounting quantities of said last row of each column for minimizing said pick-and-place cycles;
(d.7) re-allocating tasks for the placement heads without nozzle tasks in the last row, corresponding to the columns, whose element is zero, in the last row of the "assigned mounting quantities", wherein if said mounting quantities of a particular column in the last row is 0, that column will be regarded as allocated column, and said last row having the greatest mounting quantities is regarded as the allocating column, and the other remaining columns are regarded as non-allocated columns;
(d.8) final processing of the "assigned nozzle matrix" and "assigned mounting quantities"; and
(d.9) finishing nozzle tasks assignment to get an "assigned nozzle matrix" having K rows and S columns, wherein in step (d.9), said "nozzles workload" is created wherein said "nozzles workload" is a row vector having K columns, wherein each column of said "nozzles workload" stores said minimal non-zero element of each row of said "assigned mounting quantities" respectively, representing the corresponding number of pick-and-place cycles of each row of said "assigned nozzle matrix", wherein in said step (d.1), said "group nozzle number" and "group mounting quantities" are obtained from "raw nozzle number", "raw mounting quantities" with the help of nozzle-tasks limit cnt$\underline{K}$, corresponding to nozzle n in "raw nozzle number", obtain said mounting quantity Pn of nozzle n from "raw mounting quantities", which can be divided by cnt$\underline{K}$ to get a quotient $d_1$ and remainder $d_2$, wherein $d_1$ may be rounded up to get $\lceil d_1 \rceil$ which is the number of columns of the two row vectors, "group nozzle number" and "group mounting quantities", wherein each column element of said "group nozzle number" of nozzle n is the corresponding nozzle number, which is n, wherein when $d_2 \neq 0$, the first $\lceil d_1 \rceil - 1$ columns of said "group mounting quantities" vector becomes cnt$\underline{K}$, while the $\lceil d_1 \rceil$ column stores $d_2$, and said first $\lceil d_1 \rceil - 1$ columns may be called said "main column" of nozzle n and the $\lceil d_1 \rceil$ column is called said "last column" of nozzle n, wherein if nozzle n has a "last column", said last-column flag $EL_n$ may be defined for determining the sequence of last column of nozzle n in said "regrouped nozzle number" and "regrouped mounting quantities", wherein said last-column flag $EL_n$ may be initialized as 0, n∈{1, 2, . . . , N}, also initialize said global optimal cost function value GbestE of said "placement head tasks assignment" as infinite inf, wherein step (d.2) comprises the steps of determining whether or not all said last-column flags $EL_n$ are equal to 1, wherein if not, initialize count variable of nozzle replacements V as 0, and initialize count variable of said trips between auto nozzle changer W as 0, and go to said step (d.3), wherein if yes, update cnt$\underline{K}$=cnt$\underline{K}$+1 and go back to step (c), wherein in said step (d.3), for each nozzle number, define two row vectors, namely "regrouped nozzle number" and "regrouped mounting quantities", wherein said two row vectors are obtained by rearranging said two row vectors "group nozzle number" and "group mounting quantities" according to last-column flag $EL_n$, wherein step (d.3) comprises the steps of storing said main columns of all the nozzles into "regrouped nozzle number" and "regrouped mounting quantities" in ascending order of nozzle numbers respectively, and adding the last column of all the nozzles into said "regrouped nozzle number" and "regrouped mounting quantities" according to last-column flag $EL_n$, wherein if its last-column flag $EL_n$ equals to 0, the last column of the nozzle n is stored following said main columns of the nozzle n, wherein if said last-column flag $EL_n$ equals to 1, the last column of the nozzle n should be stored after all said main columns in said "regrouped nozzle number" and "regrouped mounting quantities", wherein said step (d.4) comprises a step of defining two row vectors having S elements, which are called "assigned nozzle matrix" and "assigned mounting quantities", wherein said step (d.5) comprises the steps of:

(d.5.1) setting the elements of the first row of said "assigned nozzles number", "assigned mounting quantities", wherein when the number of columns of said "regrouped nozzle number" and "regrouped mounting quantities" is not greater than S, sequentially storing each of these columns into the corresponding columns of said "assigned nozzles number" and said "assigned mounting quantities" respectively, and go to step (d.6) below, wherein when the number of columns of said "regrouped nozzle number" and "regrouped mounting quantities" is greater than S, sequentially storing the first S columns of the "regrouped nozzle number" and "regrouped mounting quantities" into the corresponding S columns of said "assigned nozzle matrix" and said "assigned mounting quantities" respectively, and go to step (d.5.2);

(d.5.2) setting the elements of all other rows of said "assigned nozzles number" and said "assigned mounting quantities", wherein the last row of each of said "assigned nozzles number" and said "assigned mounting quantities" is set as "current row", for each of the row of said "assigned nozzles number" and said "assigned mounting quantities", identifying the column having the least mounting quantities as said "allocated column", other columns called non-allocated columns, and recording the corresponding least mounting quantities as $P_k$, where k represents the row number of the current row, wherein said columns to be allocated in said "regrouped nozzle number" and said "regrouped mounting quantities" may be called "allocating column", wherein if said "allocated column" in the kth row of the "assigned nozzle matrix" and said "allocating column" of the "regrouped nozzle number" have the same nozzle number, then the mounting quantities of said "allocated column" is to be updated as the current mounting quantities plus the mounting quantities of said "allocating column" of said "regrouped mounting quantities", wherein if said "allocated column" in the kth row of said "assigned nozzle matrix" and said "allocating column" of said "regrouped nozzle number" are of different nozzle numbers, then a new k+1th row is to be created in said "assigned nozzle matrix" and said "assigned mounting quantities", wherein said nozzle number of the non-allocated columns of the k+1th row of said "assigned nozzle matrix" is set to be the same as that of the kth row, wherein said mounting quantities of each of the non-allocated columns of said "assigned mounting quantities" is obtained by subtracting P from the mounting quantities of the kth row, wherein said mounting quantities of the allocated columns of said "assigned mounting quantities" may be set as mounting quantities of said "allocating columns" of said "regrouped mounting quantities", wherein said nozzle replacement will take place and count variable of nozzle replacements may be updated as V=V+1, wherein if $P_k$ equals to 0, the count variable of trips between auto nozzle changer W remains unchanged, and if $P_k$>0, count variable of trips between auto nozzle changer should be updated as W=W+1, wherein in said step (d.6) of optimizing last row of said "assigned nozzle matrix" and the "assigned mounting quantities", wherein in the last row of said "assigned nozzle matrix" and said "assigned mounting quantities", the mounting quantities of the columns having the same nozzle number may be averaged so as to minimize the maximal mounting quantities of the last row of each column for minimizing said pick-and-place cycles, wherein in said step (d.7) of re-allocating tasks for the placement heads without nozzle tasks in the last row, corresponding to the columns, whose element is zero, in the last row of the "assigned mounting quantities", wherein if said mounting quantities of a particular column in the last row is 0, said column will be regarded as said allocated column, wherein the last row having the greatest mounting quantities is regarded as said allocating column, wherein the other remaining columns are regarded as said non-allocated columns, and a new row may be created in each of said "assigned nozzle matrix" and said "assigned mounting quantities", wherein the element belonging to each of said non-allocated columns for the newly created row is identical to the element of said adjacently upper row, and moreover, the nozzle numbers of each said allocated columns and said allocating column of the "assigned nozzle matrix" are identical, and the elements of said allocated columns of the "assigned mounting quantities" may be set as 0, wherein in the last row of the "assigned nozzle matrix" and the "assigned mounting quantities", said mounting quantities of the columns having the same nozzle number may be averaged so as to minimize the mounting quantities of the last row of each column for minimizing said corresponding pick-and-place cycles, wherein if the reduction of the newly calculated pick-and-place cycles is greater than $e_1$, the newly created row may be retained, and said count variable of nozzle replacements and trips between auto nozzle changer should be updated as V=V+1 and W=W+1, wherein if the reduction of the newly calculated pick-and-place cycles is less than $e_1$, said newly created row should be deleted, wherein $e_1$ refers to a ratio between a nozzle replacement time to average time for carrying out a pick-and-place cycle, wherein in said step (d.8), for all the columns of said last row of the "assigned mounting quantities", if the mounting quantities of each two non-zero columns are not identical, said non-zero minimum mounting quantities $P_k$ is to be recorded, a new row is created after said last row, wherein in said newly created row, the mounting quantities remains 0 if said last row has the same mounting quantities, which is also 0, wherein for other columns of this newly created row, the mounting quantities is the mounting quantities of the last row minus $P_k$, wherein if said last row of said "assigned mounting quantities" has 0 element in any of its columns, the corresponding columns of "assigned nozzle matrix" have the same corresponding elements as 0, meaning the corresponding heads do not have any nozzle task at the moment, wherein in said step (d.9) of finishing nozzle tasks assignment to get an "assigned nozzle matrix" having K rows and S columns, said "nozzles workload" is created wherein said "nozzles workload" is a row vector having K columns, wherein each column of said "nozzles workload" stores the minimal non-zero element of each row of said "assigned mounting quantities" respectively, representing the corresponding number of pick-and-place cycles of each row of said "assigned nozzle matrix".

6. The method, as recited in claim 5, wherein said step (e) comprises the steps of nozzle assignment exchange, that is switching the order of the columns in said "assigned nozzle matrix", wherein S columns will have $2^{S-1}$ ways of columns exchange, and all exchange ways will be stored, wherein in this step, iNz is the index variable of said switching manner, which is initialized as iNz=1, iNz∈[1,$2^{S-1}$].

7. The method, as recited in claim 6, wherein said step (f) comprises the steps of:
(f.1) comparing whether said iNz is greater than $2^{S-1}$, if yes, looping through all said nozzle assignment exchange ways is completed, and go to step (g.8), if not, go to step (f.2); and
(f.2) according to iNz ways of nozzle assignment exchange, switching in pairs each of said columns of "assigned nozzle matrix" to form "switched nozzle matrix";
(f.3) determining whether said completion count variable k1 is greater than K, if yes, tasks allocations for all sub-tours have been performed and go to step (g.7) below, if not, initialize sub-tour k=1, and initialize "inter-row most simultaneous pickups quantities" variable maxSP=−1, and initialize "optimal sub-tour" variable bestk=1, and go to step (f.4);
(f.4) of determining whether sub-tour k>K, if yes, replacing the row indexed by bestk of "switched component matrix" by said "inter-row best component row", and incorporating "inter-row best feeder group" into "fixed feeder group", wherein said completion flag corresponding to bestk is set as Done$_{bestk}$=1, and k1=k1+1, and go back to step (f.3), if not, go to step (f.5);
(f.5) determining whether sub-tour k has carried out component allocation, if yes, update loop variable k=k+1 and go back to step (f.4), if not, go to step (d.6);
(f.6) initializing a row vector of S columns storing the kth row of "switched nozzle matrix", wherein this row is named as said "nozzle row", and another row vector of S columns having all elements as 0 is initialized and is referred to as "component row", wherein this row is used to store each component number corresponding to each assigned nozzle matrix in said "nozzle row";
(f.7) non-repeatedly retrieving said nozzle number from said nozzle row and storing them into a set $\hat{N}$, in such a manner that different nozzle number is stored once, and initializing and resetting "simultaneous-pickup-type flag" flagS$_n$=0 for nozzle n, wherein if nozzle n corresponds to components of Mn simultaneous pickup types, the maximum value of flagS$_n$ is to be set as Mn, and flagS$_n$∈[0,Mn]; and
(f.8) determining whether said "simultaneous-pickup-type flags" flagS$_n$ corresponding to the nozzle numbers of the nozzle row are all at their maximum, i.e. flagS$_n$=Mn, where n∈$\hat{N}$, if yes, go to step (g.6) below, if not, go to step (g.1), wherein in said (f.2), the "switched nozzle matrix" includes K sub-tours, wherein define sub-tour index variable k∈{1, 2, . . . , K}, initialize and reset "completion flag" to zero for each of the sub-tours, and as an example, said "completion flag" of sub-tour k Done$_k$=0, wherein moreover, define and initialize "completion count variable" as k1=0, which is used for counting the sub-tours having finished component allocation, that is, the subtours with Done$_k$=1, k∈{1, 2, . . . , K}, wherein Done$_k$=0 means sub-tour k has not completed component allocation, whereas Done$_k$=1 means sub-tour k has completed component allocation, and said step (f.2) further comprises the step of initializing an all-zero two-dimensional array of K rows and S columns to form "switched component matrix" for storing the component number to be picked and placed by each placement head in each sub-tour, wherein each of the component numbers in said "switched component matrix" corresponds to the nozzle numbers stored in said "switched nozzle matrix", and said step (f.2) further comprises the step of initializing the optimal cost function value of "placement heads tasks assignment" bestE as infinitely large inf, wherein in said (f.7), for different combinations of flagS$_n$, said results of component allocation for sub-tour k will be different, resulting in different number of simultaneous pickups, and said step (f.7) further comprises a step of defining "in-row most simultaneous pickups quantities" maxSP$_k$, the initial condition being maxSP$_k$=−1.

8. The method, as recited in claim 7, wherein said step (g) comprises the steps of:
   (g.1) allocating a component number for each column of the component row;
   (g.2) splitting said nozzle row;
   (g.3) setting up an "ideal simultaneous pickup group", and defining the index variable of the "ideal simultaneous pickup group" as i∈[1,I], the initial condition being i=1, wherein the "ideal simultaneous pickup group" utilizes 0 to represent those heads without pick-and-place tasks;
   (g.4) updating "in-row best feeder group";
   (g.5) updating said "simultaneous-pickup-type flags" flagS$_n$ corresponding to each nozzle in the kth nozzle row, and going back to said step (f.8);
   (g.6) updating the "inter-row most simultaneous pickups quantities", the "inter-row best component row" and "inter-row best feeder group";
   (g.7) calculating said cost function of "placement heads tasks assignment" E, and if it is better than the current optimal cost function, i.e. E<bestE, then updating said current optimal placement heads tasks assignment cost function bestE=E, and updating the results of placement heads tasks assignment, including the steps of updating said "optimal nozzle matrix" to be said "switched nozzle matrix", updating said "optimal component matrix" to be said "switched component matrix", updating said "best feeder group" to be said "fixed feeder group", and updating said index variable of the switching manner iNz+1, and go back to said step (f.1);
   (g.8) determining whether said overall result obtained in step (g.7) is superior than said "global optimal cost function value" of "placement heads tasks assignment", that is bestE>GbestE, if yes, updating GbestE=bestE, updating said "global optimal nozzle matrix" to be said "optimal nozzle matrix", updating said "global optimal component matrix" to be said "optimal component matrix", updating said "global best feeder group" to be said "best feeder group" and go to step (g.9), if not, go to step (g.9) directly, GbestE is said global optimal cost function value of "placement heads tasks assignment"; and
   (g.9) updating said last-column flag EL$_n$, and go back to said step (d.2), wherein in said step (g.1), if flagS$_n$ equals to 0, then all the component numbers corresponding to nozzle n are involved in the allocation, and the allocation is performed in descending order of the component numbers, and if flagS$_n$ equals to $\hat{m}$, and $\hat{m}$≠0, then the component number within said simultaneous pickup type SPTn_$\hat{m}$ is allocated, wherein the allocation is performed in descending order of mounting quantities of the these component numbers, wherein kth column of said "nozzles workload" stores the number of pick-and-place cycles P$_k$ of the kth nozzle row, wherein suppose the component number being allocated is ĉ, and the remaining mounting quantities of the component ĉ is P$_{ĉ}$, and a new row vector having S columns may be newly created and referred to as "component row mounting quantities", wherein the elements of the newly created row vector are all initially set as P$_k$, wherein if P$_k$>Pĉ, the allocated column of "component row mounting quantities" is replace by mounting quantities Pĉ, and the remaining mounting quantities of the component ĉ should be updated to 0, while if not, the remaining mounting quantities of the component e should be updated to P$_{ĉ}$−P$_k$, wherein step (g.2) comprises the step of comparing the minimum value of "component row mounting quantities" P$_{c1}$ with "workload of the nozzle row" P$_k$, wherein if P$_{c1}$≥P$_k$, said workload of the nozzle row can be filled by said current component allocation, and if P$_{c1}$<P$_k$, said workload of the nozzle row cannot be completely filled by said current component allocation, meaning that another sub-tour needs to be added, wherein the newly added sub-tour is added in the following manner, namely adding one row after the last row of each of said "switched nozzle matrix" and said "switched component matrix", wherein the values of the element of kth to Kth row are assigned to k+1th to K+1th row respectively, wherein moreover, a column is added to "nozzles workload" after the last column thereof so that the values of the element of k+1th to Kth columns are assigned to k+2th to K+1th columns respectively, wherein the kth column stores P$_{c1}$ while the k+1th column stores P$_k$−P$_{c1}$ and the total number of sub-tour is updated to K=K+1, wherein said step (g.3) comprises the steps of:
   (g.3.1) creating a new row vector having S columns as temporary variable, which stores component row and is referred as "temporary component row", wherein step (g.3.1) also defines "in-row simultaneous pickups quantities" SP$_k$ for counting the quantities of in-row simultaneous pickups of sub-tour k, the initial condition being SP$_k$=0;
   (g.3.2) determining whether "temporary component row" is empty, if yes, go to step (g.3.3), if not, go to step (g.4) below;
   (g.3.3) determining whether the first column of "temporary component row" is 0, if yes, deleting the first column of said "temporary component row" and go back to step (g.3.2), if not, creating a new row vector having S columns which is referred to as said "ideal simultaneous pickup group", and imparting "temporary component row" to "ideal simultaneous pickup group", and go to step (g.3.4);
   (g.3.4) determining whether each column of said "ideal simultaneous pickup group" can combine with its first column thereof to realize "ideal simultaneous pickup", if not, the corresponding column of said "ideal simultaneous pickup group" is reset to zero, if yes, the corresponding column of said "temporary component row" is set to zero, and go back to step (g.3.3), wherein for "ideal simultaneous pickup", said number of heads occupied by a feeder may be obtained by dividing the width of the feeder by head interval and rounding up the quotient, said step (g.4) comprises the steps of:
   (g.4.1) determining whether the loop conditions of "ideal simultaneous pickup group" is fulfilled, that is, if i>I, go to step (g.5) below, if not, go to step (g.4.2);
   (g.4.2) determining whether all the elements of ith "ideal simultaneous pickup group" are zero, if yes, i=i+1, and go to step (g.4.4) if not, go to step (g.4.3);
   (g.4.3) allocating ith "ideal simultaneous pickup group" to form said "component row feeder group", comprising the steps of creating a new row vector which is referred to as "candidate feeder group", and imparting the values of the elements of said "ideal simultaneous pickup group" to said "candidate feeder group", and assessing each column of said "candidate feeder group". If for a certain column, the number of available feeders for the corresponding component number is 0, the elements of that corresponding column in said "candidate feeder group" is set to 0, wherein moreover, the procedures also comprise the step of recording the number of non-zero column of said "candidate feeder group" as the maximally realizable quantities of simultaneous pickups $SP_i$, wherein exploiting said "fixed feeder groups" and the available feeders left, maximally realize said "ideal simultaneous pickup group", wherein accordingly, the maximally realizable quantities of simultaneous pickups are recorded as $SP_{i1}$, wherein If $SP_i > SP_{i1}$, $SP_k = SP_k + SP_i$ and said "candidate feeder group" is to be regarded as said "component row feeder group", wherein if $SP_i \leq SP_{i1}$, $SP_k = SP_k + SP_{i1}$ and said "fixed feeder group" achieves better results and is regarded as said "component row feeder group", wherein $SP_k$ refers to "in-row simultaneous pickups quantities", wherein the columns of said "ideal simultaneous pickup group" which have been realized by the "component row feeder group" are set to zero, and go back to step (g.4.2);

(g.4.4) updating said "in-row most simultaneous pickups quantities", "in-row best component row" and "in-row best feeder group" by comparing said "in-row simultaneous pickups quantities" $SP_k$ and said "in-row most simultaneous pickups quantities" $maxSP_k$, wherein if $SP_k > maxSP_k$, then $maxSP_k = SP_k$, and said "in-row best component row" is replaced by the current component row, and said "in-row best feeder group" is replaced by "component row feeder group", and go back to step (g.4.1), wherein if $SP_k \leq maxSP_k$, go back to step (g.4.1) directly;

said step (g.6) comprises the step of comparing $Ck \times maxSP_k$ with said "inter-row most simultaneous pickups quantities", in such a manner that if $Ck \times maxSP_k > maxSP_k$ then update $maxSP = Ck \times maxSP_k$ updating said "inter-row best component row" to become "in-row best component row", updating said "inter-row best feeder group", updating optimal sub-tour bestk=k and updating sub-tour k=k+1, and going to step (f.4), wherein updating said "inter-row best feeder group" means adding "in-row best feeder group" into said "inter-row best feeder group", wherein if $Ck \times maxSP_k \leq maxSP_k$ go back to step (f.4);

wherein in said step (g.7), said cost function of said "placement heads tasks assignment" may be calculated as:

$$E = \tilde{K} + e_1 \cdot \sum_{\tilde{k}=1}^{\tilde{K}} \sum_{j=1}^{S} v_{j\tilde{k}} + e_2 \cdot \sum_{\tilde{k}=1}^{\tilde{K}} w_{\tilde{k}} - e_3 \cdot \sum_{\tilde{k}=1}^{\tilde{K}} SP_{\tilde{k}}$$

where $\tilde{K}$ being the quantities of pick-and-place cycles, $\tilde{k} \in \{1, 2, \ldots, \tilde{K}\}$ being pick-and-place cycle index, S being said number of heads on said head assembly, $j \in \{1, 2, \ldots, S\}$ being heads index, $$\sum_{\tilde{k}=1}^{\tilde{K}} \sum_{j=1}^{S} v_{j\tilde{k}}$$

being said number of nozzles replacements, $$\sum_{\tilde{k}=1}^{\tilde{K}} w_{\tilde{k}}$$

being said number of trips between auto nozzle changer, $$\sum_{\tilde{k}=1}^{\tilde{K}} SP_{\tilde{k}}$$

being said number of simultaneous pickups, $e_1$ being said weighting of nozzles replacement, $e_2$ being said weighting of the number of trips between auto nozzle changer, $e_3$ being said weighting of simultaneous pickups, wherein exemplary conditions may be set as $e_1=2$, $e_2=0.5$, $e_3=\frac{1}{6}$;

wherein in step (g.9), said last-column flag $EL_n$ is updated by updating said last-column flag $EL_1 = EL_1 + 1$ for nozzle 1, and updating said last-column flags of all nozzles in ascending order, that is, if $EL_{n-1} > 1$, then $EL_{n-1} = 0$ and $EL_n = EL_n + 1$, $EL_{n-1}$ is said last-column flag of suction nozzle n−1.

9. The method, as recited in claim 8, wherein in said step (h), said "global optimal suction nozzle number", the "global optimal component matrix" and the "global best feeder group" are fully updated in step (g.8).

* * * * *